United States Patent
Kordus, II et al.

(10) Patent No.: US 8,486,745 B2
(45) Date of Patent: *Jul. 16, 2013

(54) MULTI-TERMINAL PHASE CHANGE DEVICES

(75) Inventors: Louis Charles Kordus, II, Redwood City, CA (US); Antonietta Oliva, San Jose, CA (US); Narbeh Derharcobian, Belmont, CA (US); Vei-Han Chan, San Jose, CA (US)

(73) Assignee: Agate Logic, Inc., Sunnyvale, CA (US)

( * ) Notice: Subject to any disclaimer, the term of this patent is extended or adjusted under 35 U.S.C. 154(b) by 729 days.

This patent is subject to a terminal disclaimer.

(21) Appl. No.: 11/811,077

(22) Filed: Jun. 7, 2007

(65) Prior Publication Data

US 2007/0235707 A1 Oct. 11, 2007

Related U.S. Application Data

(62) Division of application No. 11/267,788, filed on Nov. 3, 2005, now Pat. No. 8,183,551.

(51) Int. Cl.
*H01L 45/00* (2006.01)

(52) U.S. Cl.
USPC ............ 438/54; 257/2; 257/49; 257/E29.003; 257/E45.002; 365/148; 365/165

(58) Field of Classification Search
None
See application file for complete search history.

(56) References Cited

U.S. PATENT DOCUMENTS

| | | | |
|---|---|---|---|
| 5,166,758 A | 11/1992 | Ovshinsky et al. | |
| 6,141,241 A | 10/2000 | Ovshinsky et al. | |
| 6,448,576 B1 * | 9/2002 | Davis et al. | 257/50 |
| 6,987,688 B2 | 1/2006 | Lowrey et al. | |
| 7,113,426 B2 | 9/2006 | Rueckes et al. | |
| 7,129,749 B1 | 10/2006 | Fenstermaker et al. | |
| 2003/0223285 A1 | 12/2003 | Khouri et al. | |
| 2004/0042367 A1 | 3/2004 | Kando et al. | |

(Continued)

FOREIGN PATENT DOCUMENTS

JP 2005093619 A 4/2005

OTHER PUBLICATIONS

Axon Technologies Corp.,"Technology Integration", (C) Copyright 2002 Axontechnologies Corporation.

(Continued)

*Primary Examiner* — Zandra Smith
*Assistant Examiner* — Pamela E Perkins
(74) *Attorney, Agent, or Firm* — James M. Wu; JW Law Group

(57) ABSTRACT

Phase change devices, and particularly multi-terminal phase change devices, include first and second active terminals bridged together by a phase-change material whose conductivity can be modified in accordance with a control signal applied to a control electrode. This structure allows an application in which an electrical connection can be created between the two active terminals, with the control of the connection being effected using a separate terminal or terminals. Accordingly, the resistance of the heater element can be increased independently from the resistance of the path between the two active terminals. This allows the use of smaller heater elements thus requiring less current to create the same amount of Joule heating per unit area. The resistance of the heating element does not impact the total resistance of the phase change device. The programming control can be placed outside of the main signal path through the phase change device, reducing the impact of the associated capacitance and resistance of the device.

19 Claims, 35 Drawing Sheets

U.S. PATENT DOCUMENTS

| | | | |
|---|---|---|---|
| 2004/0105301 | A1 | 6/2004 | Toyoda et al. |
| 2004/0140523 | A1 | 7/2004 | Hudgens et al. |
| 2004/0178401 | A1* | 9/2004 | Ovshinsky et al. ............... 257/2 |
| 2004/0178403 | A1 | 9/2004 | Ovshinsky |
| 2004/0178404 | A1 | 9/2004 | Ovshinsky |
| 2004/0179394 | A1 | 9/2004 | Ovshinsky et al. |
| 2004/0188668 | A1* | 9/2004 | Hamann et al. ................... 257/2 |
| 2005/0062035 | A1 | 3/2005 | Berlin et al. |
| 2005/0062497 | A1 | 3/2005 | Pellizzer et al. |
| 2005/0142731 | A1 | 6/2005 | Wicker |
| 2005/0167645 | A1 | 8/2005 | Kim et al. |
| 2006/0071244 | A1 | 4/2006 | Gutsche et al. |
| 2006/0097240 | A1* | 5/2006 | Lowrey et al. .................... 257/5 |
| 2006/0097775 | A1 | 5/2006 | Zhu et al. |
| 2006/0102927 | A1 | 5/2006 | Fujita et al. |
| 2006/0166455 | A1* | 7/2006 | Gordon et al. ................ 438/385 |
| 2006/0249724 | A1 | 11/2006 | Krusin-Elbaum et al. |
| 2006/0278895 | A1 | 12/2006 | Burr et al. |
| 2006/0279978 | A1* | 12/2006 | Krusin-Elbaum et al. .... 365/148 |
| 2007/0099405 | A1 | 5/2007 | Oliva et al. |
| 2007/0235784 | A1 | 10/2007 | Krusin-Elbaum et al. |
| 2008/0048169 | A1 | 2/2008 | Doyle et al. |
| 2008/0206922 | A1 | 8/2008 | Oliva et al. |

OTHER PUBLICATIONS

Kozicki et al., "Non-Volatile Memory Based on Solid Electrolytes"; Axon Technologies Corp. (C) Copyright 2002 Axontechnologies Corporation.

Axon Technologies Corp., "Partnership Overview", (C) Copyright 2002 Axontechnologies Corporation, p. 1-2.

Axon Technologies Corp.,"Key Benefits", (C) Copyright 2002 Axontechnologies Corporation.

Axon Technologies Corp. "How PMCm Works" (C) Copyright 2002 Axontechnologies Corporation; p. 1-2.

Axon Technologies Corp., "What is PMCm?" (C) Copyright 2002 Axontechnologies Corporation; p. 1-3.

Axon Technologies Corp. "The Roadmap" (C) Copyright 2002 Axontechnologies Corporation; p. 1-3.

Axon Technologies Corp., "Technical Papers" (C) Copyright 2002 Axontechnologies Corporation.

Axon Technologies Corp., "Scalability" (C) Copyright 2002 Axontechnologies Corporation.

Axon Technologies Corp., "Partnership Overview" (C) Copyright 2002 Axontechnologies Corporation.

Axon Technologies Corp. "List of Patents" (C) Copyright 2002 Axontechnologies Corporation.

Axon Technologies Corp. "How PMCm Works" (C) Copyright 2002 Axontechnologies Corporation.

Axon Technologies Corp. "PMCm Technology Overview" (C) Copyright 2002 Axontechnologies Corporation.

Maimon et al. "Chalcogenide Memory Arrays: Characterization and Radiation Effects"; IEEE Transactions on Nuclear Science, vol. 50, No. 6, Dec. 2003.

Pellizzer et al. "Novel uTrench Phase-Change Memory Cell for Embedded and Stand-Alone Non-volatile Memory Applications"; 0-7803-8289-7/04/$04/$20.00 (C) 2004 IEEE.

Kozicki et al. "Nanoscale Memory Elements Based on Solid-State Electrolytes"; IEEE Transactions on Nanotechnology, vol. 4No. 3, May 2005; 1536-125x/$20.00(c) 2005 IEEE.

Lai, et al. OUM—A 180 nm Nonvolatile Memory Cell Element Technology For Stand Alone and Embedded Applications; Intel Corp., RN3-01 2200 Mission College Blvd, Santa Clara, CA95052-8119; 0-7803-7050-3/01/$10.00 (C) 2001 IEEE.

Hellemans, Alexander, News "A New Phase in Nonvolatile Memory?", IEEE Spectrum Jun. 2005, 1 page.

* cited by examiner

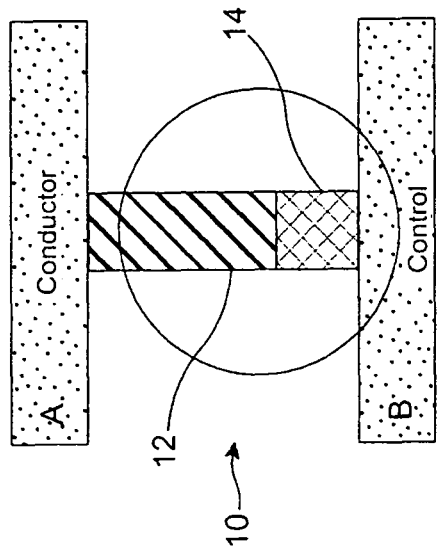
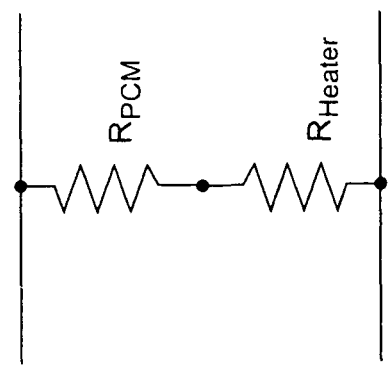
FIG. 1

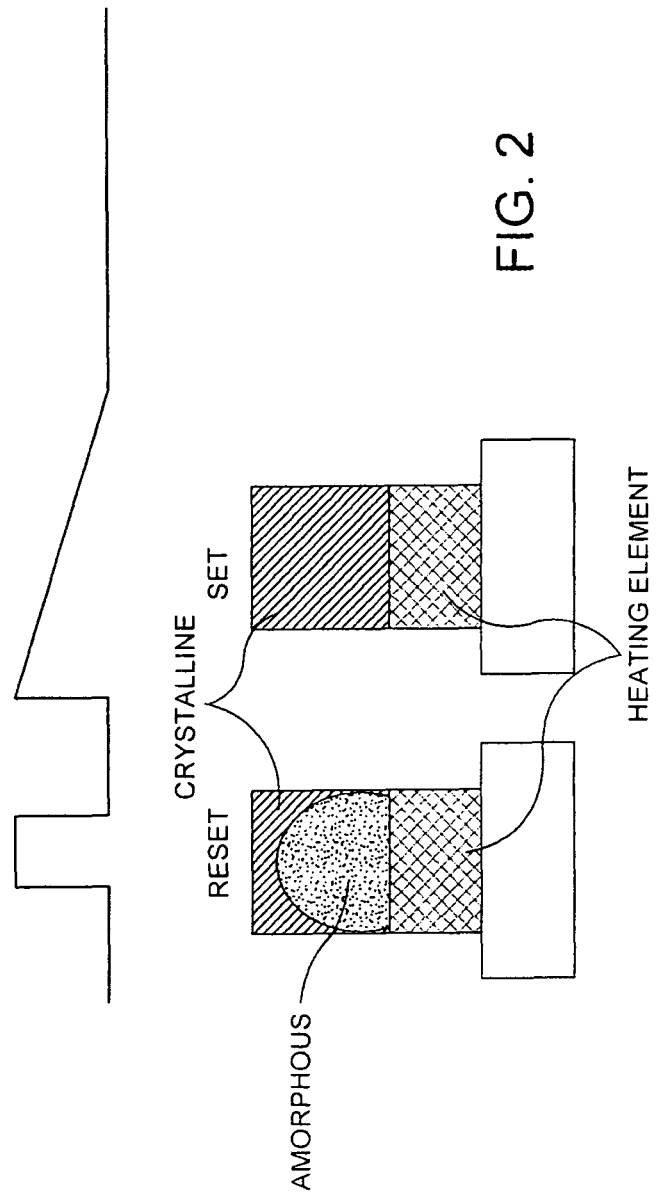

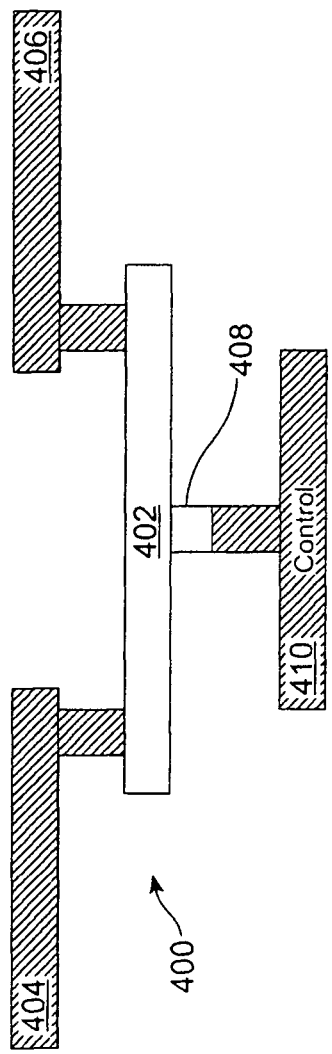

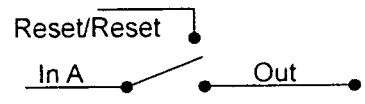
FIG. 17D
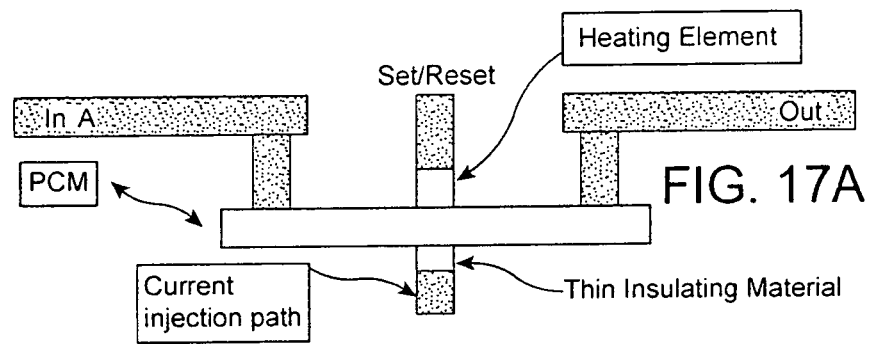
FIG. 17A
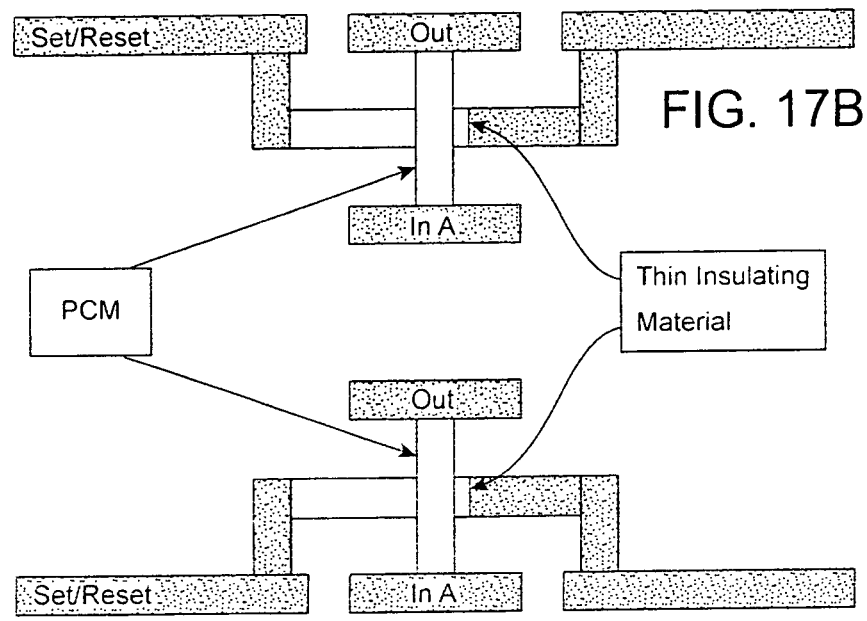
FIG. 17B
FIG. 17C

MULTI-TERMINAL PHASE CHANGE DEVICES

CROSS-REFERENCE TO RELATED APPLICATIONS

The present application is a divisional of prior U.S. patent application Ser. No. 11/267,788, filed on Nov. 3, 2005 now U.S. Pat. No. 8,183,551, the disclosure of which is hereby incorporated by reference in its entirety for all purposes.

BACKGROUND OF THE INVENTION

1. Field of the Invention

The invention relates to phase change devices (PCDs) used in logic and memory applications.

2. Description of the Related Art

A two-terminal phase change device (PCD) 10 is shown in FIG. 1, and consists of a heating element 14 connected to a control terminal B. Heating element 14 acts as both a heater and an electrically conducting node in thermal and electrical contact with phase change material (PCM) 12, which connects to another metal terminal A which is simply an electrically conducting node connecting the PCD 10 to other circuitry (not shown). An electrical schematic of PCD 10 is shown in the right-hand side of FIG. 1, with the heating element 14 being represented as a resistance $R_{heater}$, and the PCM 12 being represented as a resistance $R_{PCM}$.

In operation, a programming pulse is applied to PCD 10 in such a way as to selectively create a high resistance state or a low resistance state in the PCM 12, as explained with reference to FIGS. 2 and 3A. In particular, phase change materials are a class of materials which can change phase from crystalline structures to amorphous structures or back when under different thermal treatments, supplied in this example by heating element 14 by way of control terminal B. When phase change material 14 is heated above its crystallization temperature and cooled down gradually, it tends to form a crystalline phase and exhibits low electrical resistance (SET). When the phase change material is heated above its melting temperature and cooled down abruptly, it forms amorphous phase and exhibits high electrical resistance (RESET). Essentially, the material operates as a programmable resistor with two distinct electrical resistance values. Phase change materials may contain atom elements in group 4, 5 and 6 such as Ge, As, Se, Te.

FIG. 3A is a graph of the temperature profile for crystalline and amorphous phase change. Ta and Tx are melting and transition temperatures. t1 and t2 are time control periods for amorphous and crystallize state formation.

The two-terminal device of FIG. 1 consists of a volume of phase change material contacted on one end by a low resistance metal and on the other end contacted to a higher resistance interface. In order to program the device an electrical current is passed through the higher resistance interface into the phase change material. The heat generated in the high resistance interface along with the current injected into the phase change material causes the phase change material to change state. The way in which the current is removed will determine the final state of the material. By rapidly quenching the phase change material the material will be left in an amorphous state. If the materials temperature is slowly brought through the phase transition region the material will be left in a crystalline state.

Phase change materials have found their applications in optical disk memory such as CD-RW and DVD-RW based on its optical index change properties between crystalline and amorphous phases. In optical disk memory applications, a laser beam is used to introduce heat into the materials to switch between crystalline and amorphous states which have different refractive index. In integrated circuit applications, electric current is used to introduce joule heating into the phase change memory to switch between crystalline and amorphous states which have different resistance.

A problem associated with the two-terminal device structure depicted in FIG. 1 is that the heating element must be incorporated at one end of the device, which means that the heating element is directly in the electrical path between the two terminals of the device which directly affects the electrical characteristics of the device. This causes contention between the electrical characteristics of the device during its programming state and its read or non-programming state. In order to Set or Reset the PCD 10, the joule heating via the heating element 14 is used to transition the PCM 12 to the appropriate temperature. This requires that a trade-off be made between the electrical resistance of the PCD 10 and the thermal resistance of the PCD due to the heating element 14. In typical circuit application, designers are accustomed to being able to adjust resistance by making the material in the conductive path large. In this case growing the conductive path would also mean changing the amount of joule heating per unit area that is applied to the PCM 12 given that the programming circuitry does not change. The conducting path through the device incorporates the heater element which inherently needs to be of high resistance in order to heat at low enough currents. This means that a substantially high series resistance is included in the path between the two nodes. Thus there are three variables with strong interdependence that can not be decoupled in the 2 terminal device: resistance in the on state, current, resistance in the off state (the last to relate directly to the heating of the Phase change material).

Another issue with two-terminal devices is that the circuitry needed to program the device is directly connected to one or both of the terminals of the device. This means that the control function that determines the state of the device is also part of the nodes that are used to read the device or in any other non-programming state. This also can add capacitive loading or current paths to the device that would be seen in normal operations at the two terminals.

BRIEF SUMMARY OF THE INVENTION

In accordance with one aspect of the invention, a multi-terminal phase change device (PCD) is provided, allowing separation of the Set/Reset controls from the target electrical path. One way of accomplishing this is by constructing a device that consists of a phase change material (PCM) that connects to a conducting terminal(s) in an electrical path. Other terminal(s) used to control the Set/Reset operations through heater element(s) are connected separately to the PCM. This structure allows an application in which an electrical connection can be created between two terminals, with the control of the connection being effected using a separate terminal or terminals. The benefits are manifold. The resistance of the heater element can be increased independently from the resistance of the path between the two conductive terminals. This allows the use of smaller heater elements thus requiring less current to create the same amount of Joule heating per unit area. The resistance of the heating element does not impact the total resistance of the PCD. As the improvements are done to the heater element the resistance across the two conducting elements of the switch is not increased. The programming control can be placed outside of the main signal path through the PCD, reducing the impact of the associated capacitance and resistance of the device.

BRIEF DESCRIPTION OF THE SEVERAL VIEWS OF THE DRAWINGS

Many advantages of the present invention will be apparent to those skilled in the art with a reading of this specification in conjunction with the attached drawings, wherein like reference numerals are applied to like elements, and wherein:

FIG. 1 is schematic diagram of a two-terminal phase change device and an equivalent electrical schematic thereof;

FIG. 2 is a graph of the temperature profile for crystalline and amorphous phase change;

FIG. 4A is a diagram of a three-terminal phase change device in a stacked arrangement;

FIGS. 17A-17C are schematic diagrams of phase change devices having one or more isolated control/programming nodes;

FIG. 17D is an electrical schematic of the devices of FIGS. 17A-17C;

DETAILED DESCRIPTION OF THE INVENTION

FIG. 4A shows an example of a three-terminal PCD (phase change device) 400 in accordance with the invention. PCD 400 includes a pair of active electrically conductive terminals, 404, 406, bridged together by phase change material (PCM) 402. Terminals 404 and 406 connect PCD 400 to other circuit devices (not shown) whose exact nature depends on the particular application.

PCM 402 is in thermal and electrical contact with a heating element 408, which is part of a control terminal 410 through which current is applied to the heating element to activate same. When activated in a controlled manner as explained further below, heating element 408 induces a phase change in PCM 402. Two important phases are a high resistance amorphous phase, which causes the PCM 402 to be effectively high resistance, thereby establishing a virtual open circuit condition between active terminals 404 and 406, and a low resistance polycrystalline phase, which electrically connects the active terminals 404 and 406 to one another in a closed circuit configuration. The two conditions are designated Reset (amorphous phases) and Set (polycrystalline phase). It should also be appreciated that there are many states of resistance between the highest resistance state and the lowest resistance state that may be useful for many types of applications.

Figure 3A:
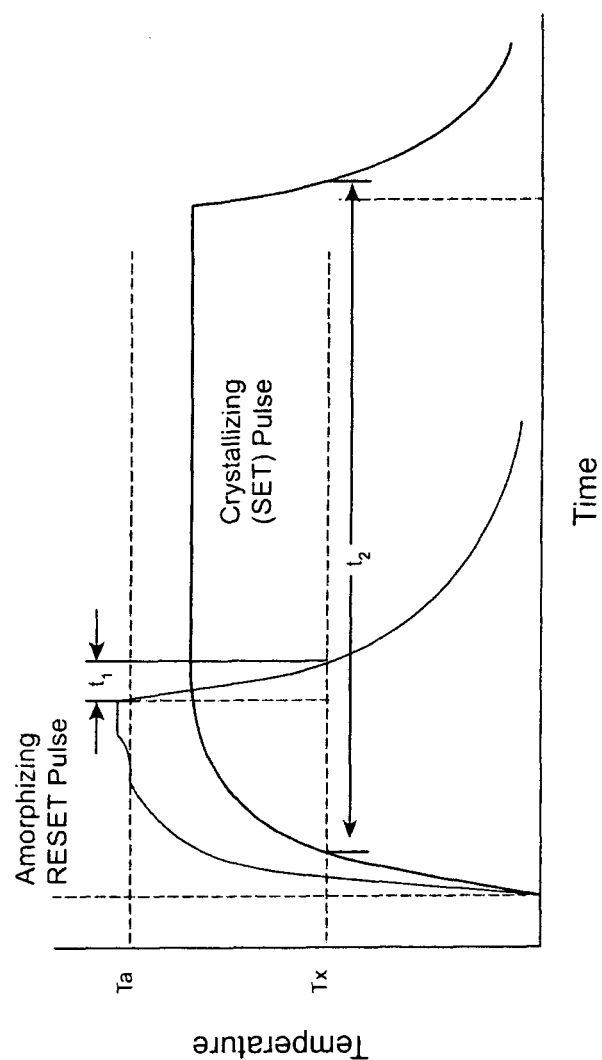
FIG. 3A shows IV curves of a phase change material for crystalline (low resistance) and amorphous (high resistance) states.
Figure 3B:
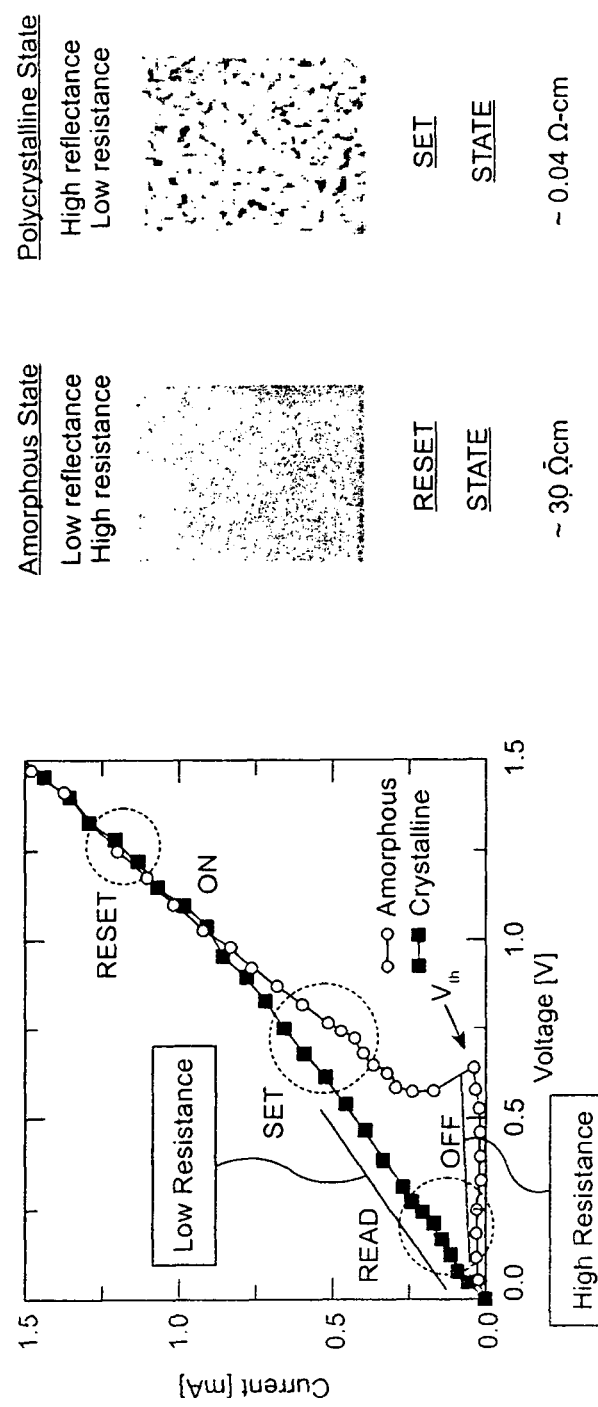
FIG. 3B is a plot relating to the programming steps by which the two states—Set and Reset—of a PCD are realized.

PCM 402 is selected from a class of well-known chalcogenide materials, which include those containing atom elements in group 4, 5 and 6 such as Ge, As, Se, Te and behaving in the manner described—that is, as programmable resistors with two different electrical resistance values. The programming steps by which these two states—Set and Reset—are realized are further described with reference to the characteristics curves of PCM shown in FIG. 3B. First, a voltage is applied at the control terminal (410), bringing the PCM 402 to what is referred to as the snap back region, carrier avalanche generation. At this point a small amount voltage can dramatically increase the current through the device. At a given current the temperature of the heating element (408) can rise to the point at which PCM 402 reaches its phase transition temperature. After reaching this temperature, the mechanism for cooling the PCM 402 determines the state in which the PCM remains after conclusion of programming. If the PCM 402 is cooled slowly, by slowly ramping the applied voltage or current down, PCM 402 will assume the crystalline low resistance form (Set). If the temperature of PCM 402 is reduced rapidly (the voltage quickly removed), PCM 402 will retain an amorphous, high resistance form (Reset). Thus a typical programming regime simply requires that the appropriate voltage waveform be applied to the device 400. It will be appreciated that during programming—that is, in a programming mode when a control signal is being applied to the control terminal 410—an electrical path is established between the control terminal and one of the active terminals 404 or 406, in the form of a current passing between the control terminal and one the active terminals (in either direction), for example by way application of a voltage (positive or negative) across the control terminal and one of the active terminals. This electrical path activates heating element 408, which presents a finite resistance, and which induces the phase change in the PCM 402. Conversely, when not in the programming mode—that is, when the PCD is operating in a field mode after it has been programmed—the control terminal 410 is substantially electrically inactive. It is removed or isolated from the PCD, and ideally does not draw current or add current, or present any loading on the circuit.

Figure 4B:
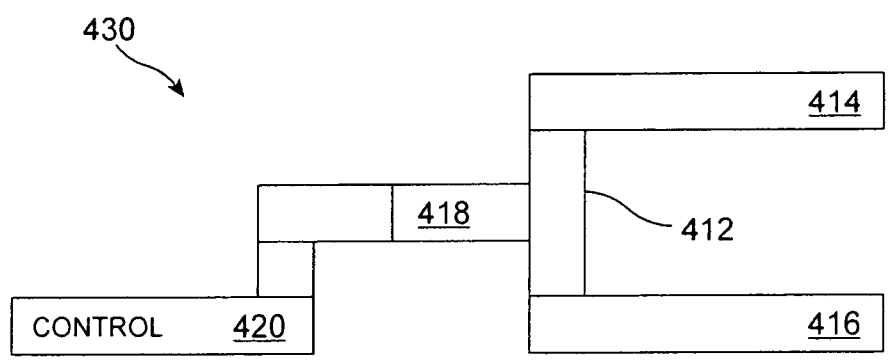
FIG. 4B is a diagram of a three-terminal phase change device in a lateral arrangement.

In the arrangement of FIG. 4A, the device is herein referred to as a stacked three-terminal PCD. Alternatively, a lateral three-terminal PCD arrangement can be provided, as shown in FIG. 4B. Lateral three-terminal PCD 430 has a different physical layout, consisting of first (414) and second (416) active terminals that overlie one another, and that are bridged by a PCM 412 in thermal contact with a heating element 418. A control terminal 420 activates the heating element 418, causing the change in phase of the PCM 412 in the manner described above.

Figure 4C:
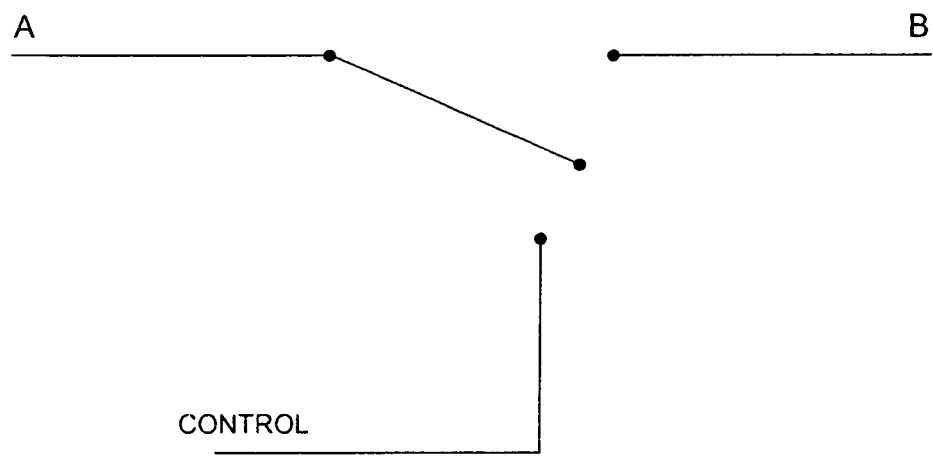
FIG. 4C is a circuit diagram modeling the devices of FIGS. 4A and 4B.

The lateral arrangement behaves in an effectively identical manner to that of the stacked arrangement, and both can be modeled by the circuit shown in FIG. 4C, which depicts a switch between nodes A and B which can be selectively opened (high resistance, amorphous phase of PCM 412) or closed (low resistance, polycrystalline phase of PCM 412). However, the physical layout and fabrication processes of the two arrangements are different, and different advantages may inure to each of the arrangements depending on the contemplated application. In the case of the lateral PCD 430, a very small heating element 418 can be realized, using atomic layer deposition, rather than using via or contact processing techniques which may be required for the stacked arrangement and which are limited by photolithographic and etch techniques. This may require a larger cell area in the X,Y plan but the device scales better in shrinking technologies than the stacked arrangement.

Figure 7:
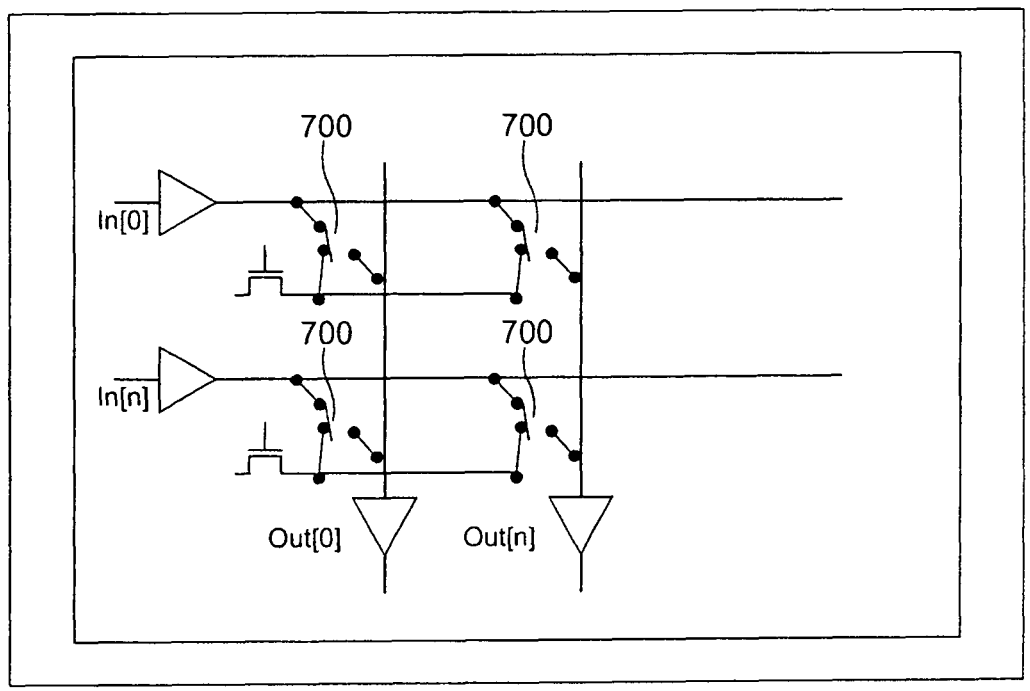
FIG. 7 is a schematic diagram depicting the use of phase change devices in a cross bar switching structure.

The multi-terminal device PCD can be used as a means of creating a cross-bar or switching fabric in a programmable device. The two methods of creating a cross bar structure are a cross-point structure and a mux structure. The cross-point structure simply connects two wires directly via some type of switch, which, in accordance with the invention, can be a multi-terminal device switch 700, four of which are shown in FIG. 7. Each wire-2-wire connection has exactly one switch associated or one cross-point of contact. The mux structure uses multiple switches or pass gates in order to route one of multiple wires to one other wire, and by layer multiple multiplexers together one can achieve a structure that allows one ore more wire to connect to one or more other wires.

Typically the cross bar functions as a means of electrically connecting one or more nodes to one or more other nodes. The electrical characteristics of the cross bar are defined by the application that it is being used in. Often a very low resistance connecting state is required, less than 1K ohms, a high off-resistance state is desired to reduce leakage through the non-selected lines, and in the configuration of FIG. 7, the ability to control the connection with an alternate control node is realized.

A multi-terminal phase change device in accordance with the invention is ultimately more useful to such an application than a two terminal device for certain applications. It removes the control/programming element out of the direct path of the electrical connection of the two wires. It also gives a level of electrical separation from the wires that are being connected in the crossbar.

Figure 5:
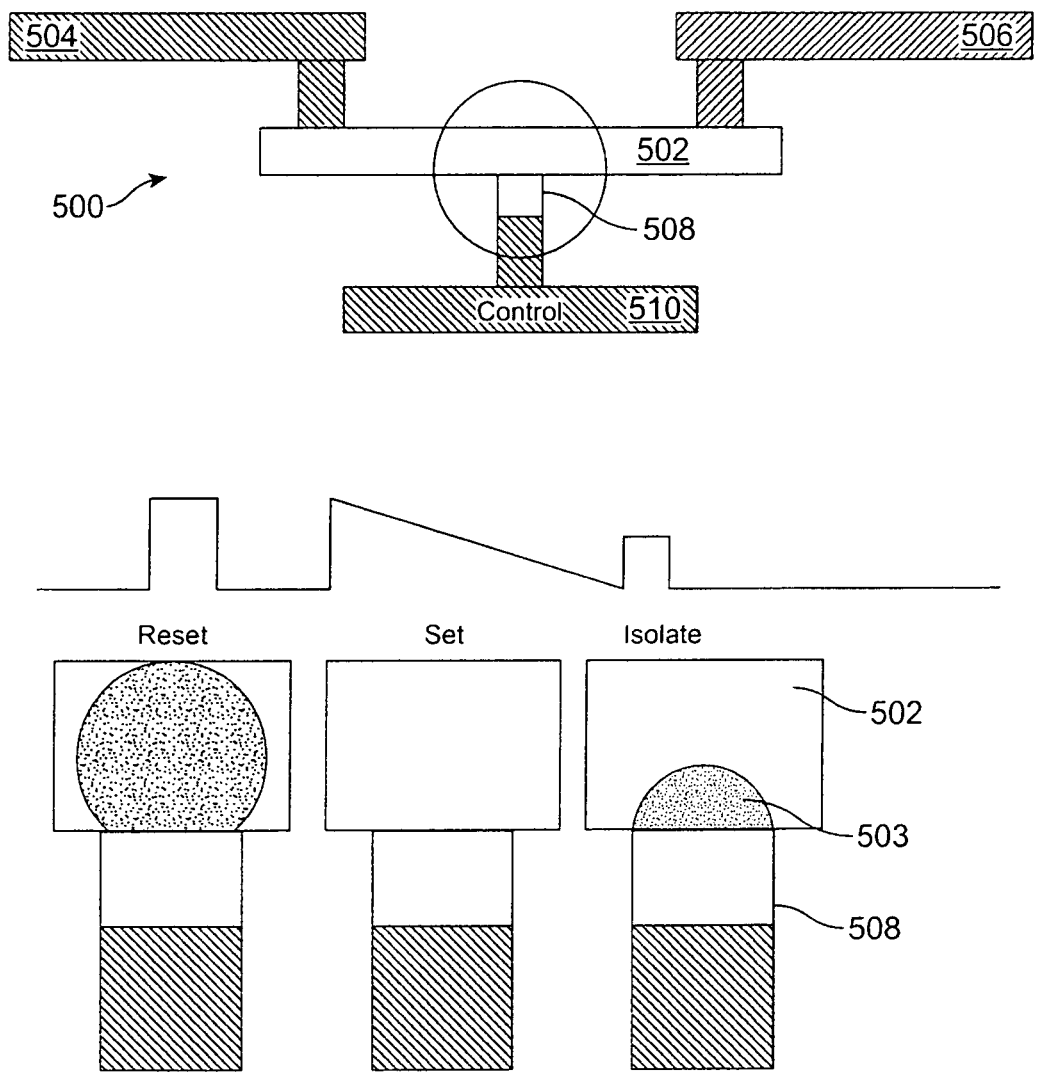
FIG. 5 is a diagrammatic illustration of the phase behavior of a self-isolating device.

In addition to the Set and Reset states, a third state can be induced in the PCD, as explained with reference to FIG. 5. This state, herein referred to as self-isolation, can be realized if the Set voltage pulse discussed above is followed by a controlled pulse that leaves portion of the volume (503) of PCM 502 in the amorphous, high resistance phase, while leaving the larger portion of the material in its low resistance phase. The volume of amorphous material 503 will ideally be adjacent to the heating element 508, effectively isolating the heater node from the remainder of the device 500, which may be important for reducing leakage currents or loading by the programming control terminal 520 which thereby disturb the behavior of PCD 500 or other devices (not shown) connected to terminals 504 and 506.

Another method of implementing a multi-terminal device would be to have one or more of the control/programming nodes isolated with some type of barrier material that under high fields would allow for current to be injected into the substrate to assist the programming operation but under normal operating conditions would not have any current or very minimal current attributed to that node(s). This may be necessary for instances where the heating element is so resistive that not enough current would actually be available to assist in the programming of the device. Such structure is illustrated in FIGS. 17A-C, and an equivalent schematic is provided in FIG. 17D. FIG. 17A relates to a stacked-type of arrangement, while FIGS. 17B and 17C relate to a lateral-type of arrangement.

Figure 6A:
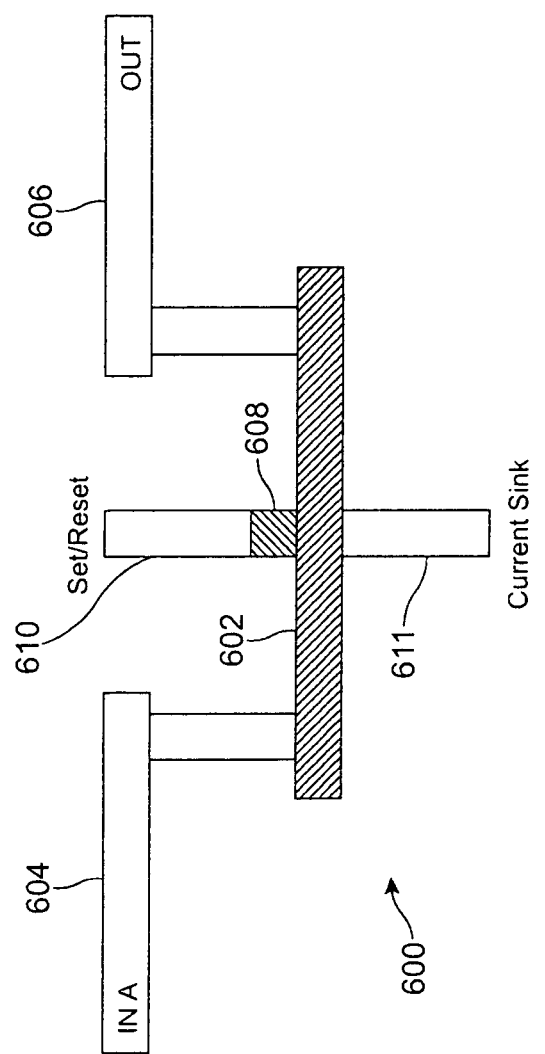
FIG. 6A is a schematic diagram of a stacked arrangement of a four-terminal phase-change device having, in addition to two active terminals, a pair of control terminals.
Figure 6B:
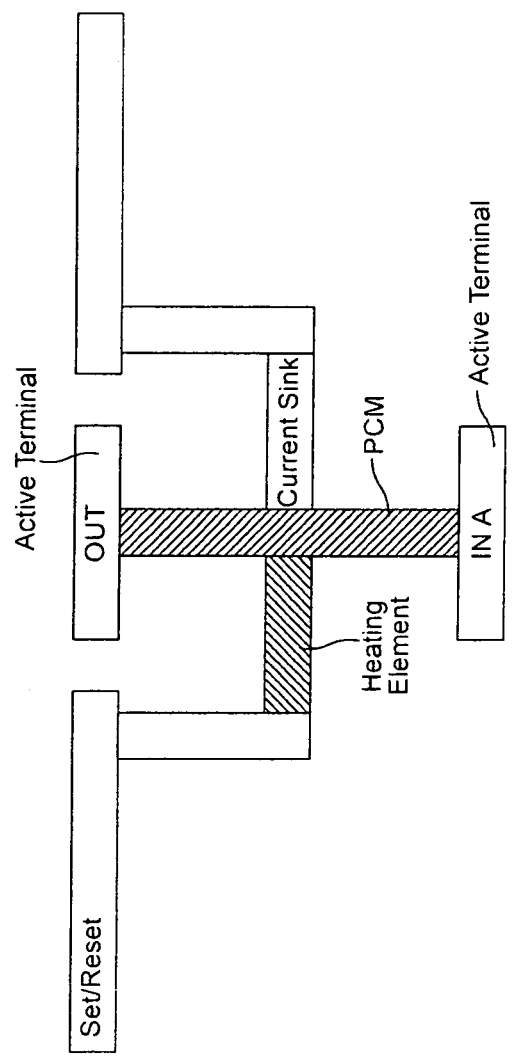
FIGS. 6B and 6C are schematic diagrams of stacked arrangements of four-terminal phase-change devices.
Figure 6C:
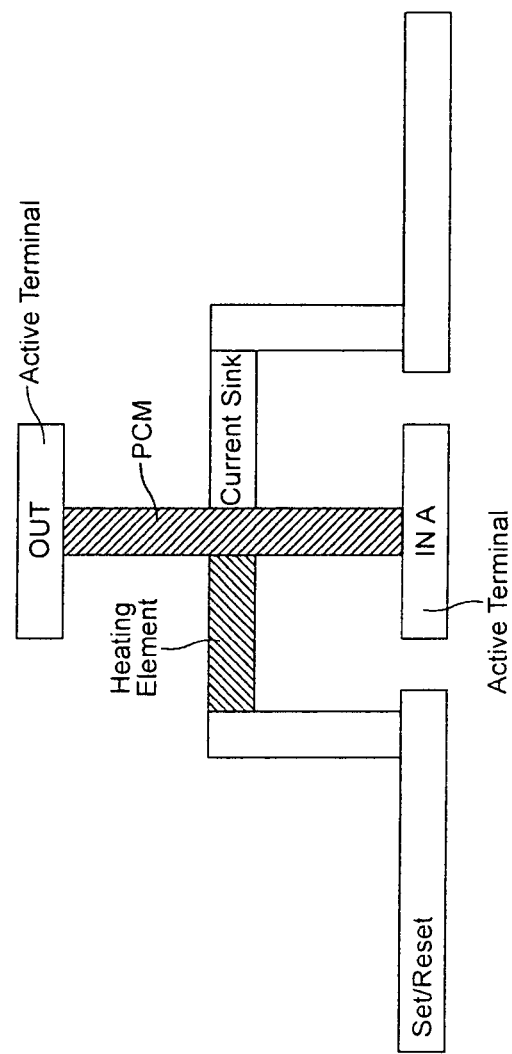

Other devices can be realized with more than three terminals. FIG. 6A shows a four-terminal PCD 600 having, in addition to active terminals 604 (In A) and 606 (Out), a pair of control terminals 610 and 611 at least one of which is in thermal communication, by way of a heating element (608), with PCM 602. Although only one of the programming nodes in FIGS. 6A-6C are shown with at heating element the, device could be constructed with both programming nodes having a heating element. A current path between the control terminals 610 and 611 is thus formed, across PCM 602. Set/Reset circuitry (not shown) is connected to control terminal 610, and a suitable current/voltage programming regime is applied in order to transition PCM 602 to the desired phase/resistance state. The use of more than one programming node enhances the ability to more completely heat the PCM and thus reach a better ratio between the high resistance and low resistance states. Using multiple programming nodes also allows for the creating of a conducting path for programming without having to go through any of the terminals that are used in the normal operation. This potentially removes some of the loading on function wires in the device. Further, while only one current sink (terminal 611) is shown, the invention is not so limited and multiple current sinks can be provided to thereby achieve an optimum Set/Reset resistance ratio and improve reliability and fabrication yield. Terminal 611 can also be provided with a second heating element (not shown) adjacent PCM 602 to supplement the heating element of terminal 610. An advantage of a second heating element opposite heating element 608 would be symmetrical heating of PCM 602, on both sides of the PCM, requiring less power to achieve the desired phase change in the material and less power in the overall system in which multiple PCDs such as PCD 600 are used.

Figure 6D:
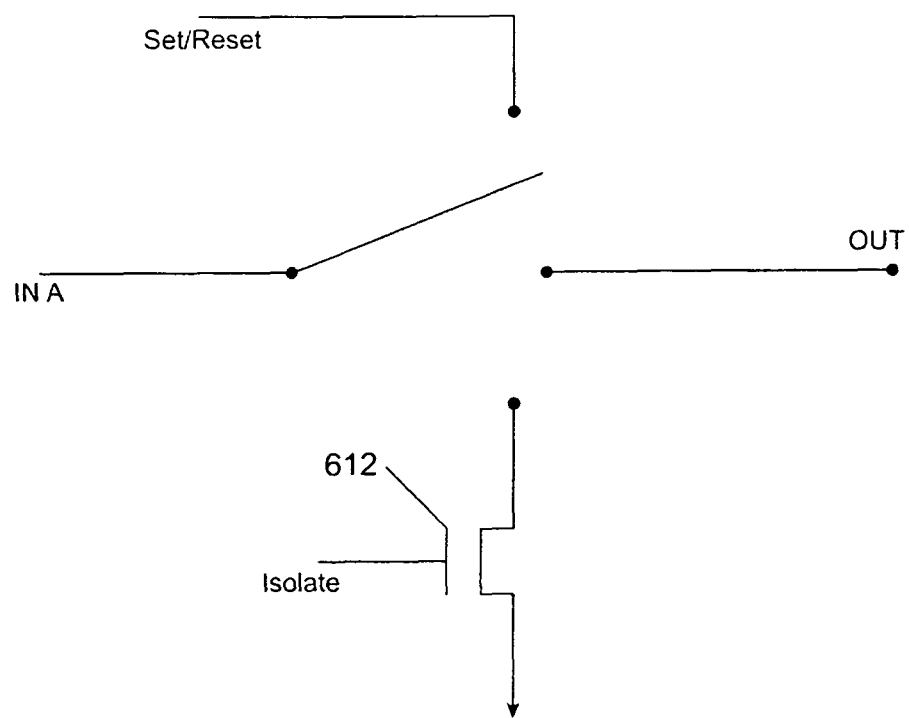
FIG. 6D is a circuit diagram modeling the devices of FIGS. 6A-6C.

Four-terminal PCD 600 can have various configurations in addition to the stacked arrangement of FIG. 6A. In particular, as shown in FIGS. 6B and 6C, lateral arrangements having different input and output terminals can be realized. An equivalent electrical representation is shown in FIG. 6D. The Isolate terminal is provided in order to prevent current leakage through the current sink. This is effected by turning the pass gate 612 off (that is, open-circuiting the path to ground) when PCM (602 in FIG. 6A) is being operated in the conductive (polycrystalline) state, but turning it on (short-circuiting the path to ground) when the terminal 611 (in FIG. 6A) is operating as a current sink especially during the Set/Reset programming operations.

Depending on the circuitry and architecture of the overall device, it may be better to use PCDs having a stacked structure or a lateral structure or both. The placement of the heating element will also depend on the circuitry and the architecture. In some circumstances it is desired to bring the heating element up to layers above the device in order to get the most efficient use of wires in the upper layers of the integrated circuit. There may be a desire to bring the programming node to the layers below quickly, such as transistors that would be used to drive the current into the heater element.

Figure 18C:
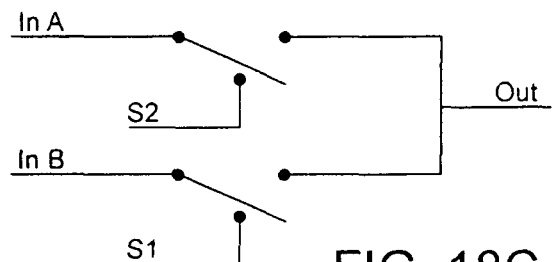
FIG. 18C is a schematic diagram of the two arrangements of FIGS. 18A and 18B.
Figure 18A:
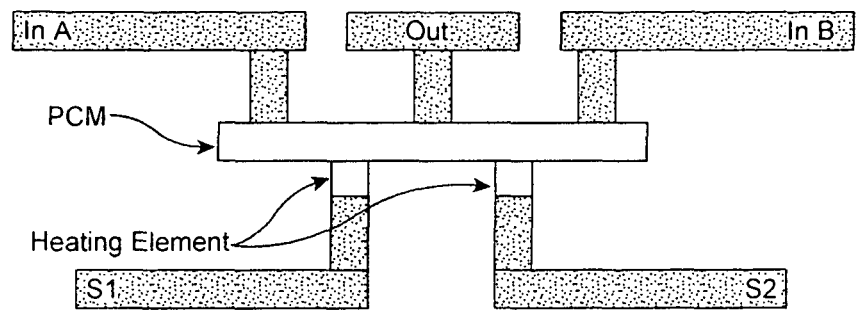
FIG. 18A depicts stacked-typed arrangement of a multiplexer with a three-terminal device.
Figure 18B:
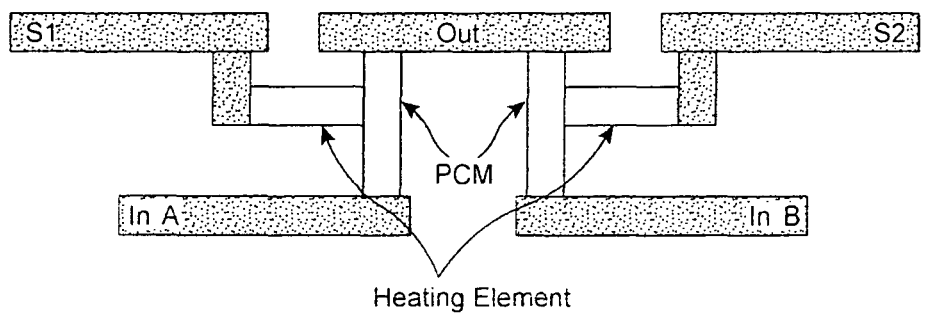
FIG. 18B depicts a lateral-type arrangement of a multiplexer with a three-terminal device.
Figure 19C:
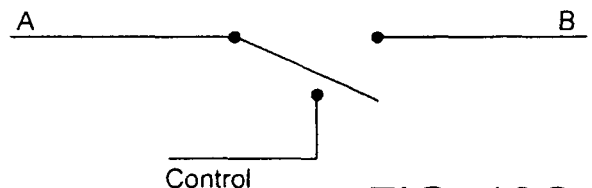
FIG. 19C is an electrical schematic of the devices of FIGS. 19A-19B.
Figure 19A:
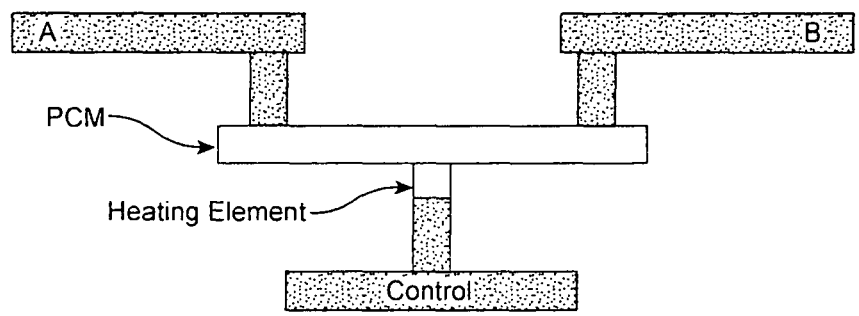
FIGS. 19A and 19B depict stacked-type (FIG. 19A) and lateral-type (FIG. 19B) arrangements of pass gates using a three-terminal device in accordance with an aspect of the invention.
Figure 19B:
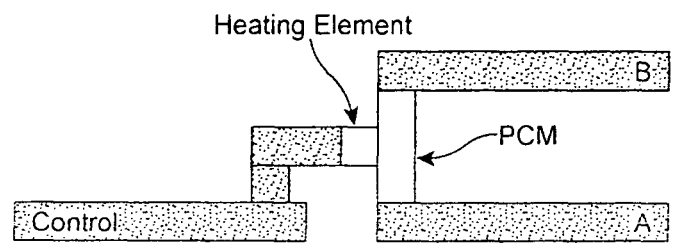

The multi-terminal device can take on the function of a CMOS pass gate, multiplexer, OR gate, AND gate, and so forth. FIG. 18A depicts stacked-typed arrangement of a multiplexer with a three-terminal device. FIG. 18B depicts a lateral-type arrangement. A schematic illustration of these two arrangements is provided in FIG. 18C. FIGS. 19A and 19B depict stacked-type (FIG. 19A) and lateral-type (FIG. 19B) arrangements of passgates using a three-terminal device in accordance with an aspect of the invention.

Figure 20:
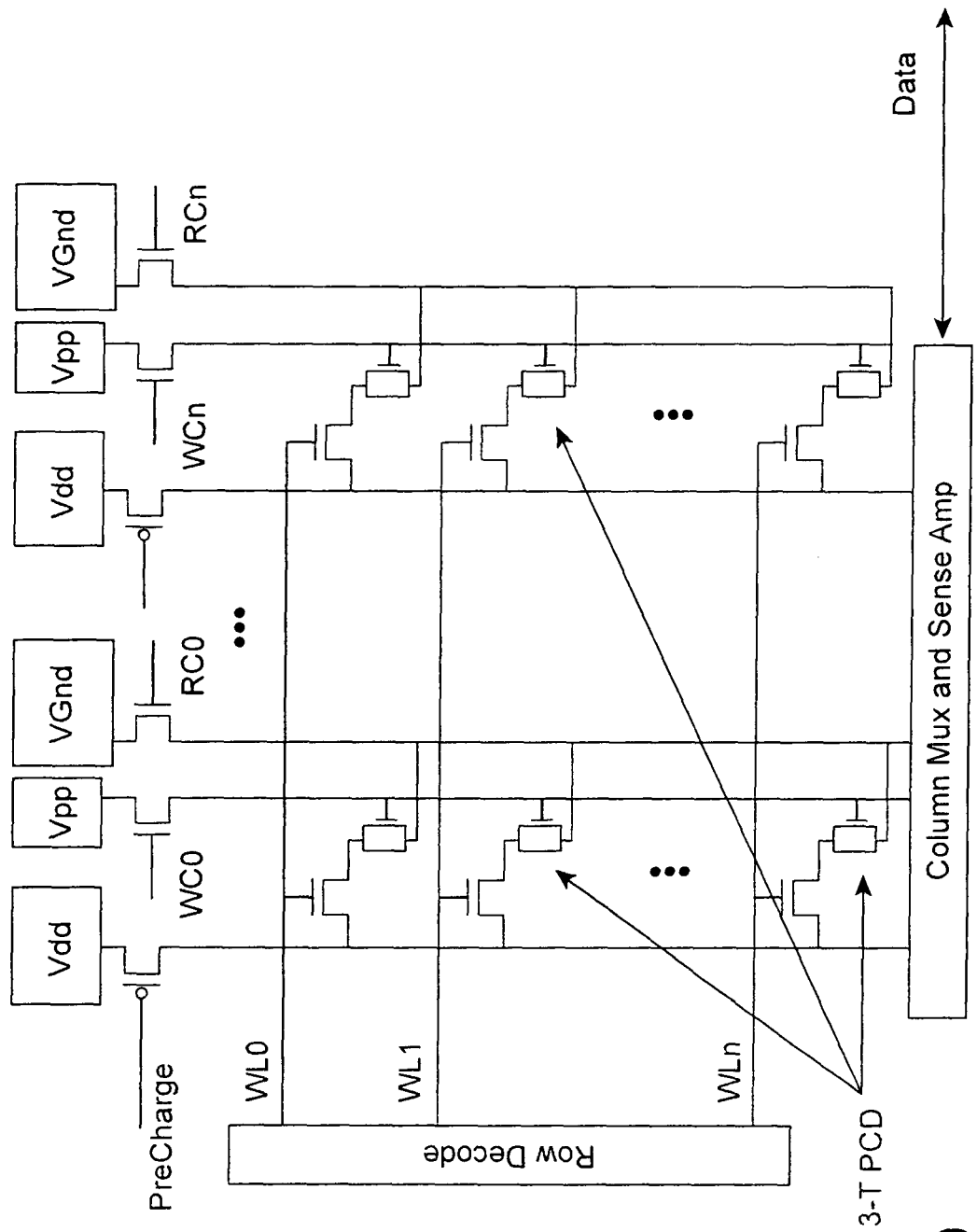
FIG. 20 is a schematic diagram of a memory array in which three-terminal phase change devices are used.
Figure 21:
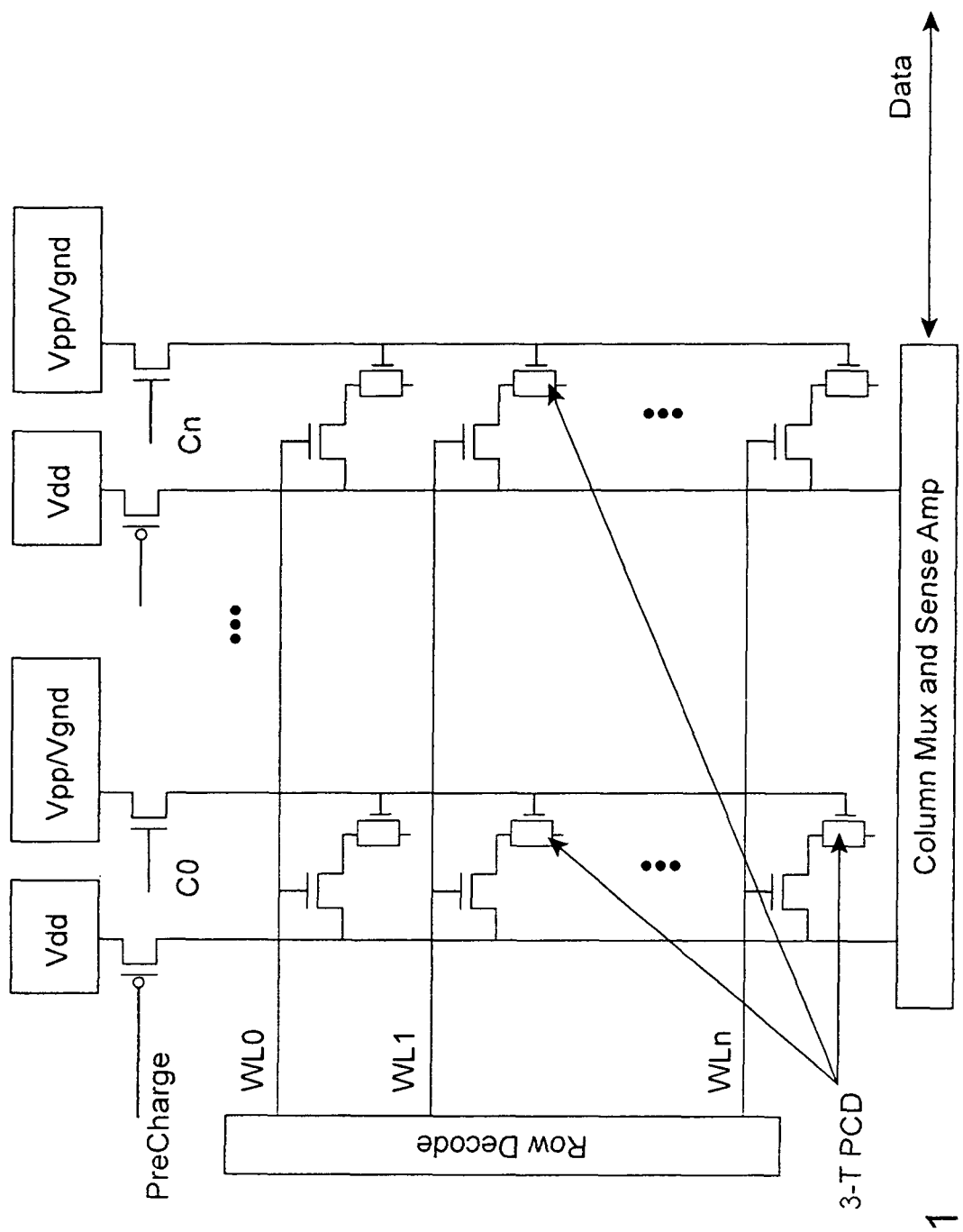
FIG. 21 is a schematic diagram of a memory array in which three-terminal phase change devices are used, wherein one of the terminals is not connected, and the control node is used for programming and reading.

FIG. 20 is a schematic diagram of a memory array in which three-terminal PCDs devices (3-T PCD) are used in accordance with the invention. A variation on this arrangement is shown in FIG. 21, in which one of the terminals of the 3-T PCDs is not connected, and the control node is used for programming and reading.

There are various ways to implement the switch fabric that incorporates a separate set of terminals programming the device. It can also be conceived that the input and the output to the device can be created as a plurality of nodes, such that one or more wires can be connected to more than one output.

Figure 8J:
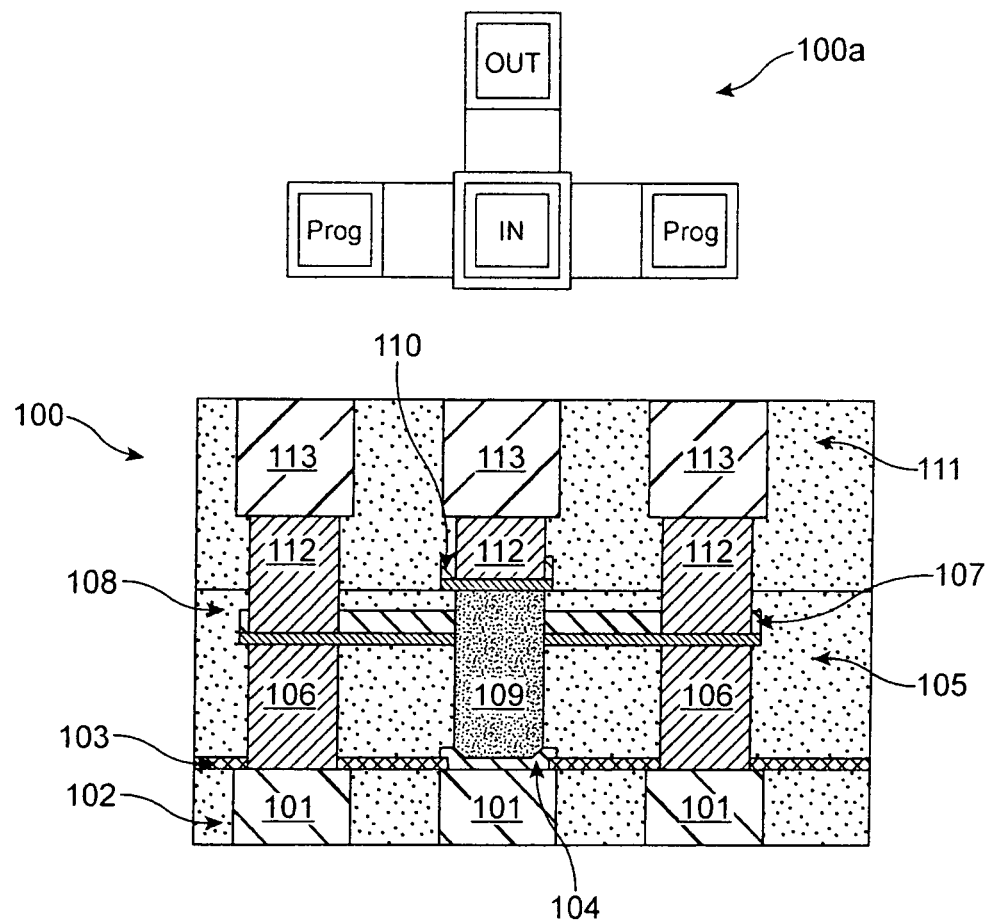
FIGS. 8A-8J are schematic representations of steps of a first process flow directed at fabricating a multi-terminal.
Figure 8A:
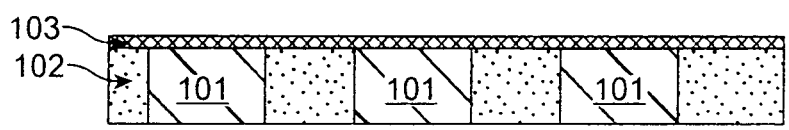

Phase change devices (PCDs) can be used as memory elements, logic switches or programmable resistors. Each flavor of device may require a different number of terminals and may need a different connectivity strategy, based on the circuit application. For standard integrated circuits all these flavors of devices may be used on the same chip. Therefore, in order to reduce manufacturing costs, it becomes important to develop a manufacturing flow that allows building these devices with the same process steps. The type of device is controlled primarily by layout and programming conditions. PCD fabrication process flows in accordance with the invention may offer one or more of the following advantages:

1) Allowing fabrication of a multi-terminal phase change device
2) Providing integration above metal 1 and at any metal level (Metalx)
3) Symmetrical placement of heating elements on both side of the PCM material for more efficient Joule heating and better thermal isolation
4) Allows building of devices having different configurations (two terminal or multi-terminal) on the same chip using the same process steps
5) Allows flexible connection to the terminals as required for a more efficient connectivity to the rest of the circuitry
6) Only one or two extra masks needed compared to prior art FIGS. 8A-8I are schematic representations of steps of a first process flow directed at fabricating a multi-terminal PCD 100 depicted in cross-section and top plan view in FIG. 8J. The process begins in Step 1 with a wafer after full CMOS processing up to metalx 101, which is exemplarily any metal layer in the CMOS process. Metalx 101 is surrounded by a dielectric material 102 and is covered with an etch stop layer 103, as shown in FIG. 8A. This is usually the case for both AlCu (Aluminum-Copper) and Cu (Copper) BEOL (back-end of the line) flows. The cross-section in FIG. 8A is of planar surface that is typical of the Cu BEOL flow. However, similar process steps can be applied to an AlCu flow.

Figure 8B:
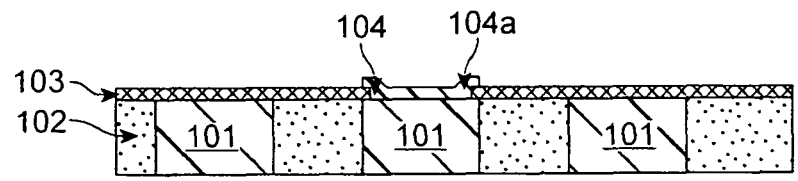

In Step 2, a via hole 104 is patterned into the etch stop layer 103 to open a contact to the metal below. A diffusion barrier metal 104a such as TaN or TiN of 250 Å is deposited and patterned to cover the via hole in Step 3, as seen in FIG. 8B. W or CoWP can also be used as the diffusion barrier material. The diffusion barrier metal 104a represents the interface material to the bottom electrode or Input/Output pin for the multi-terminal PCDa (for example IN A in FIGS. 6B and 6C). For more advanced Cu metallization schemes using diffusion barriers selectively grown on top of the Cu, step 2-3 in the flow described below can be skipped resulting in further simplification and reduction of process steps.

Figure 8C:
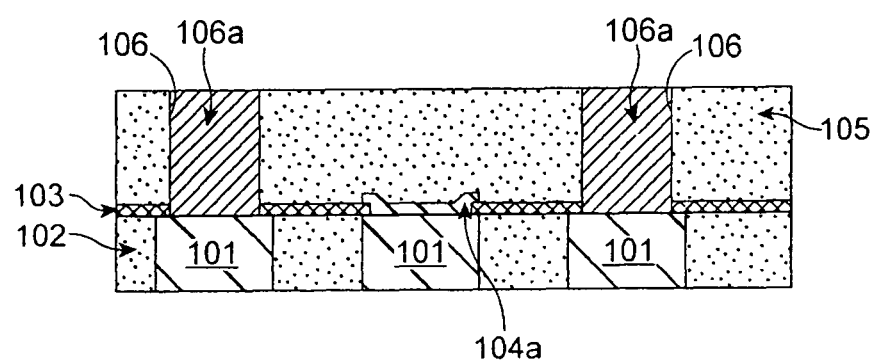

FIG. 8C relates to Steps 4 and 5. In Step 4, a dielectric (~1000 Å) 105 of the same material typically used for ILD (Inter-Level Dielectric) is deposited. Then, in Step 5, via holes 106 are etched in the dielectric, landing on the metal below. The via holes are filled with metal 106a and planarized. The via holes represent the connection of the program pins to the heater elements and may be needed only when connection to metal below is preferred. Otherwise, this process step can be omitted.

Figure 8D:
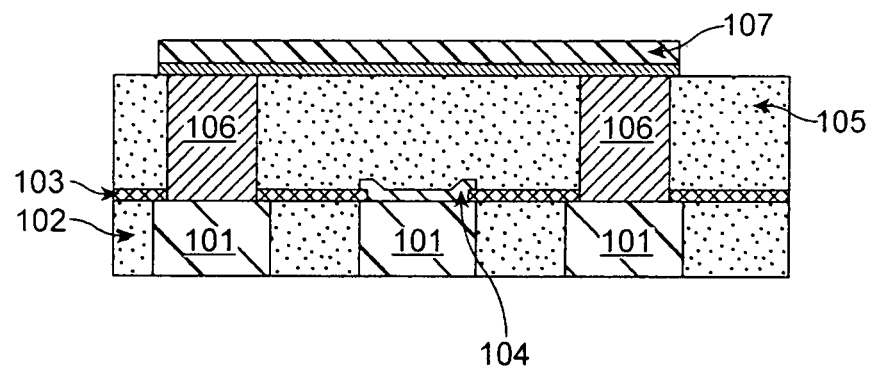
Figure 8E:
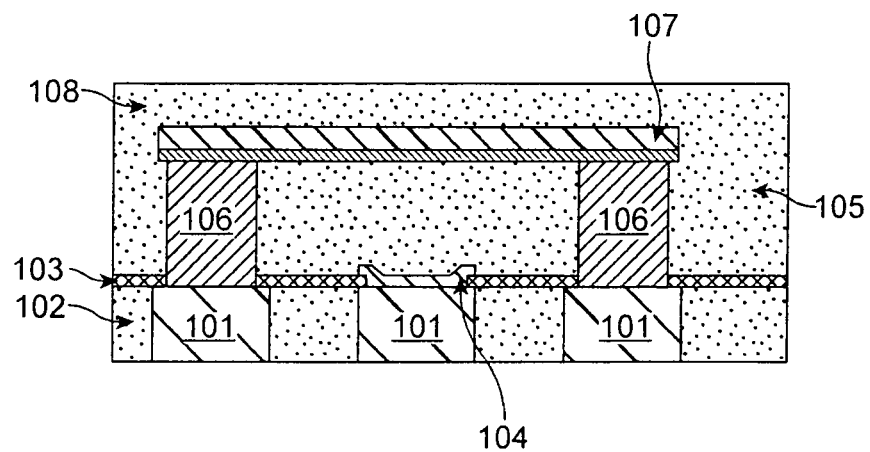
Figure 8F:
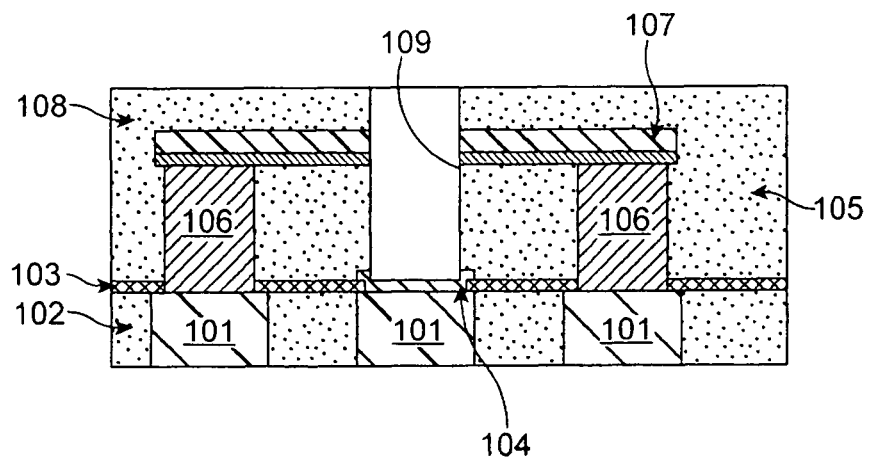

In Step 6 a diffusion barrier/etch stop stack 107 is deposited, using for example TaN/SiN (~200 Å/250 Å), and patterned to define the heater region, or W or CoWP. This is illustrated in FIG. 8D. Next, in Step 7 (FIG. 8E), an additional ILD dielectric layer 108 is deposited (~1000 Å) on top of the heater stack 107. In Step 8, a hole 109 is etched through the heater stack into the dielectric as shown in FIG. 8F).

Figure 8G:
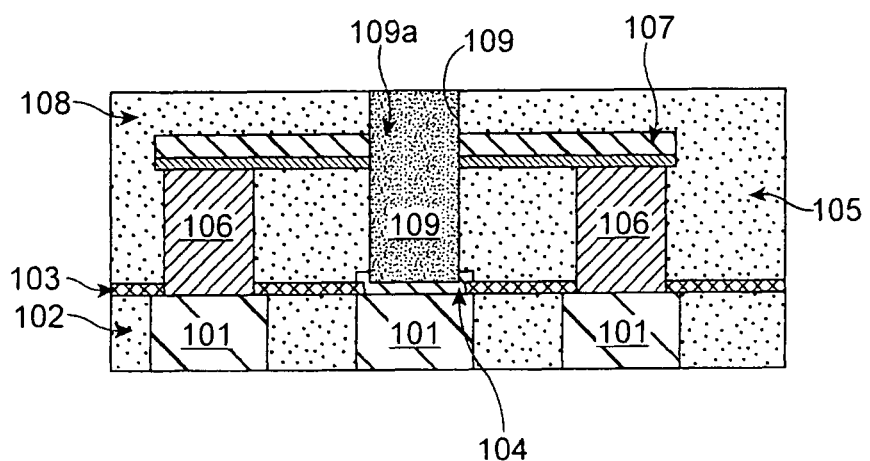

In Step 9, phase change material (PCM) 109a is deposited into hole 109, as illustrated in FIG. 8G. In order to obtain a good fill, the hole 109 is designed to have a low aspect ratio. This is achieved by limiting the hole height. The deposited material is then planarized.

Figure 8H:
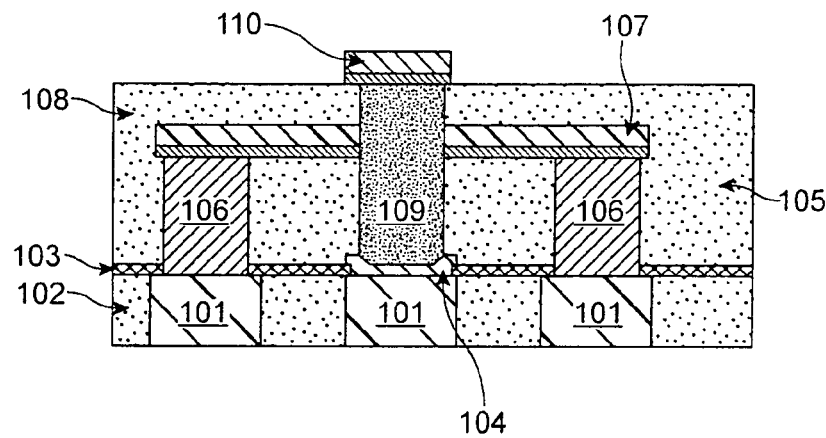

A diffusion barrier/etch stop stack 110 (TiN or TaN/SiN (~200 Å/250 Å) or W or CoWP) is deposited, in Step 10, to allow sealing of the PCM and prevent material inter-diffusion at the interface with the top electrode. Step 10 is illustrated in FIG. 8H.

Figure 8I:
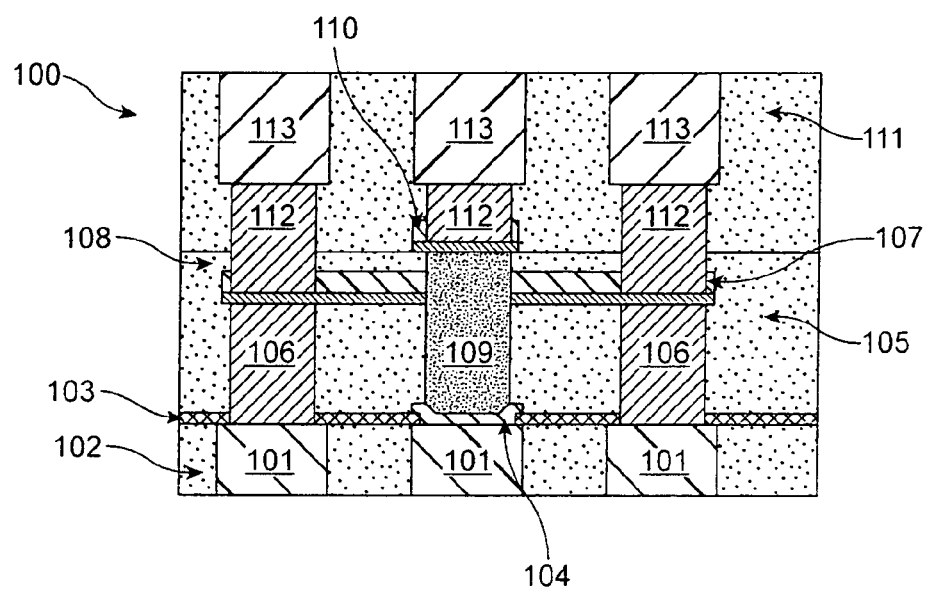

In Step 11, ILD oxide 111 is deposited and planarized, as shown in FIG. 8I. At this point standard BEOL processing for defining vias 112 and metal 113 can be resumed.

It will be appreciated that the etch stop layer on top of the heater and PCM seal layers help prevent over-etching and punching though the diffusion barrier film while etching the standard Mx to Mx+1 vias. This should help improve via resistance.

Figure 9:
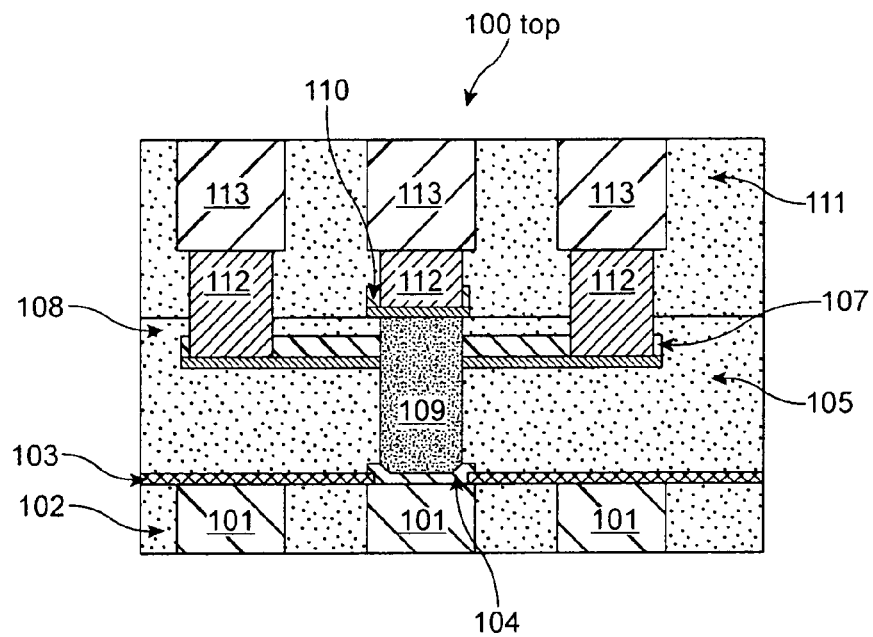
FIG. 9 is a schematic view of a four-terminal top-connectivity device.
Figure 10:
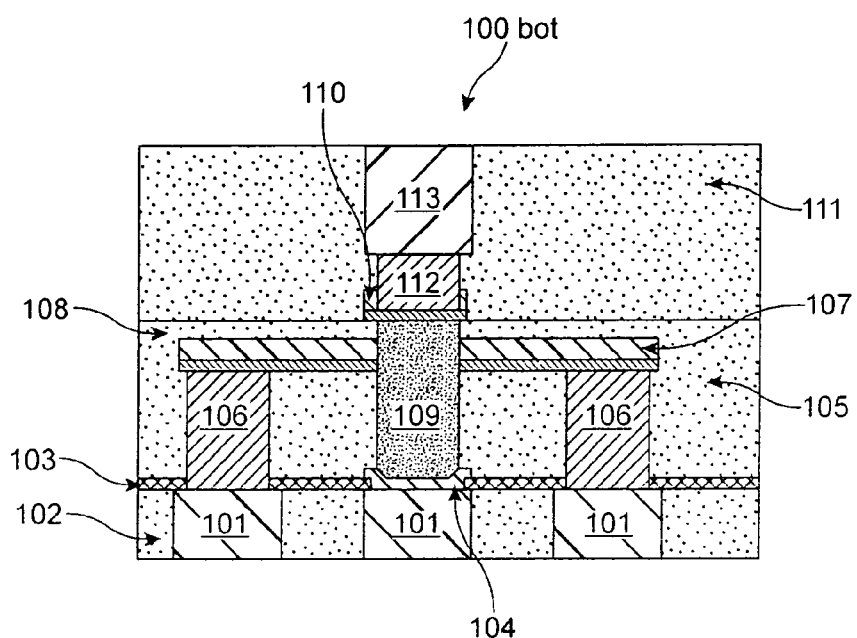
FIG. 10 is a schematic view of a four-terminal bottom-connectivity device.
Figure 11:
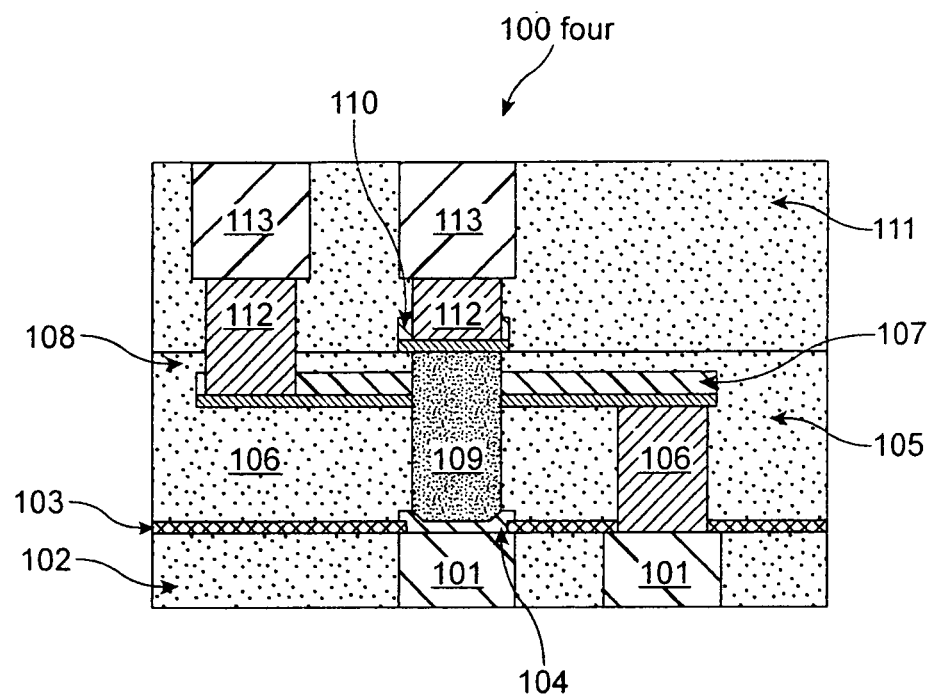
FIG. 11 is a layout of a four-terminal device having a mixed top/bottom connectivity pattern.
Figure 12:
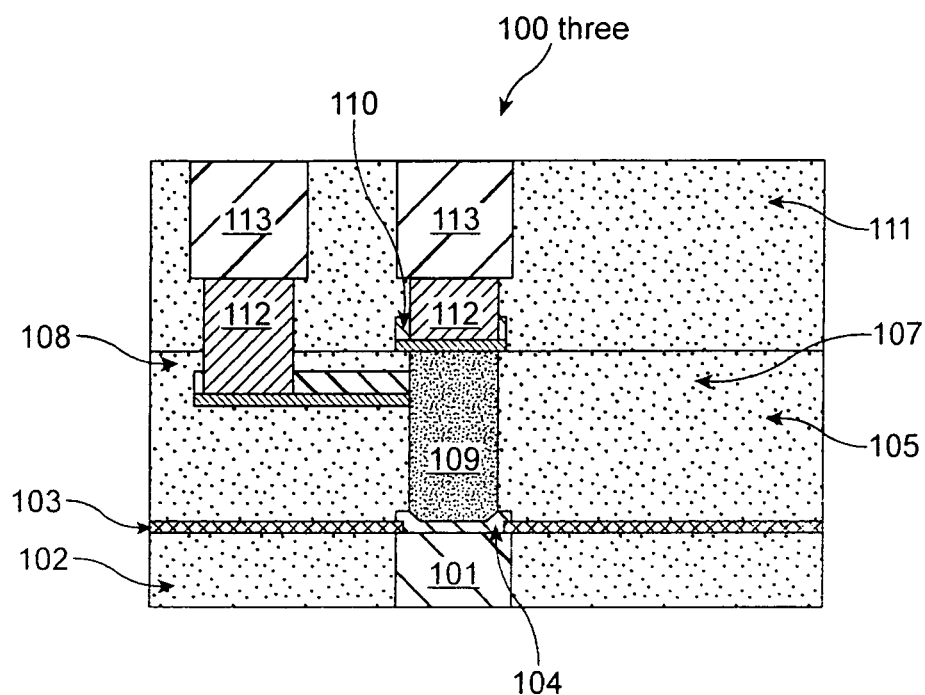
FIG. 12 is a layout of a three-terminal device.
Figure 13A:
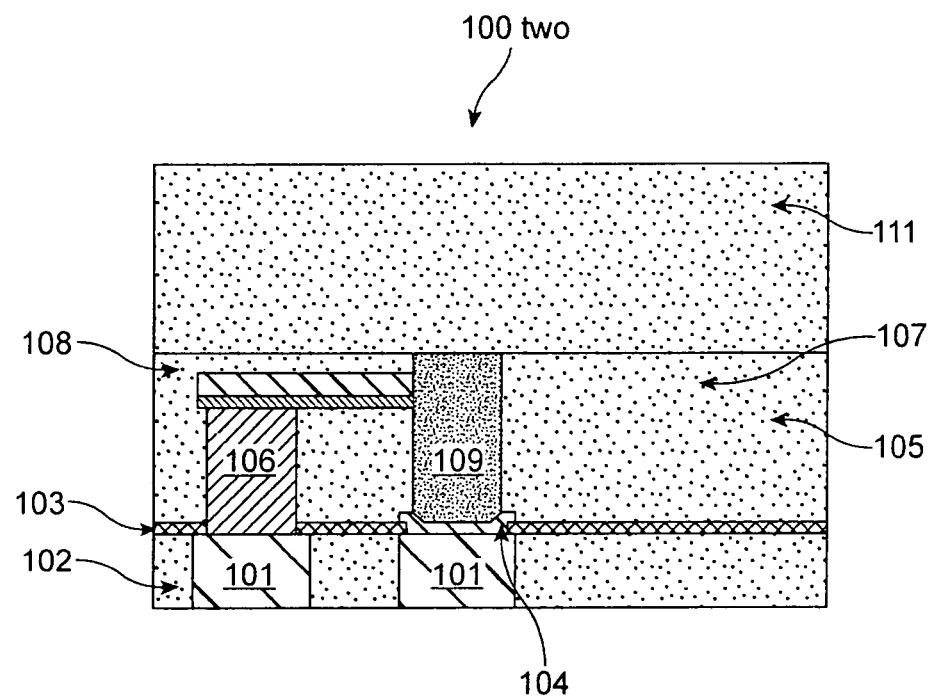
FIGS. 13A and 13B are layouts of of a two-terminal device, in cross-sectional and top plan views, respectively.
Figure 13B:
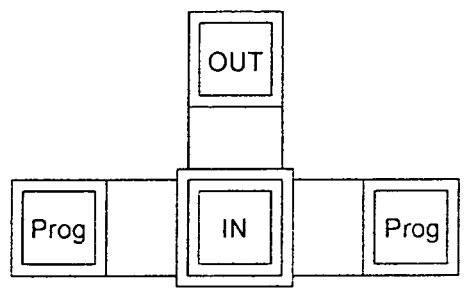
Figure 14:
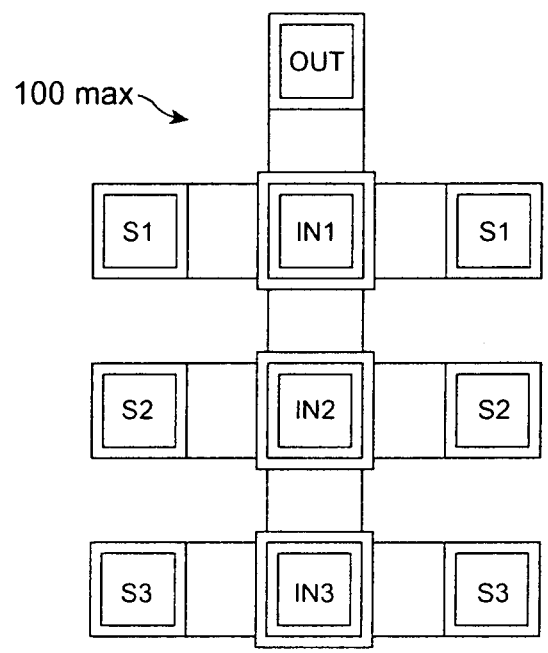
FIG. 14 is top plan view of an arrangement showing multiple PCDs used to obtain a 3:1 multiplexer device fabricated in accordance with the first process flow.

The device of FIG. 8J is configured to have top and bottom connectivity. It will be appreciated that a similar process flow can be used to produce a four-terminal top-connectivity device $100_{top}$ illustrated in FIG. 9, and a four-terminal bottom-connectivity device $100_{bot}$ illustrated in FIG. 10. FIG. 11 illustrates the cross-sectional view of a four-terminal device $100_{four}$ having a mixed top/bottom connectivity pattern fabricated using a similar process flow, Device $100_{four}$ has a device floorplan that is <20F2. This is three to four times smaller than the area of prior art memory cells using two terminal phase change devices. FIG. 12 illustrates the cross-sectional view of a three-terminal device $100_{three}$. FIG. 13A illustrates a cross-sectional view of a two-terminal device using a similar process flow. FIG. 13B is a multi-terminal layout view of a device fabricated in accordance with the first process flow. FIG. 14 illustrates the layout of a 3:1 multiplexer device fabricated in accordance with the first process flow.

Figure 15A:
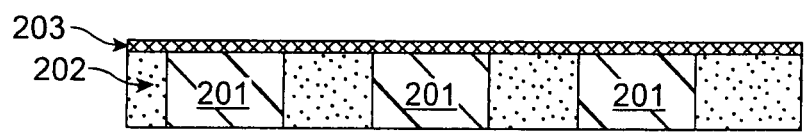
FIGS. 15A-15M relate to a second process flow for fabricating phase change devices in accordance with the invention.
Figure 15B:
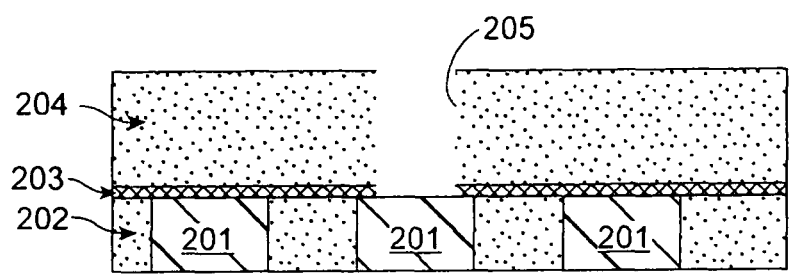

FIGS. 15A-15M relate to a second process flow for fabricating phase change devices in accordance with the invention. Beginning with Step 1, described with reference to FIG. 15A, the process again starts with a wafer after full CMOS processing up to Metalx 201 surrounded by dielectric 202. Metalx 201 is covered with an etch stop layer 203. This is usually the case for both AlCu and Cu BEOL flows. The cross-section shows a planar surface that is typical of the Cu BEOL flow. However, the same process steps can be applied also to the AlCu flow.

In Step 2 (FIG. 15B), an oxide layer 204 of the same kind used for inter-level dielectric (ILD) is deposited (1000 Å), and a heater hole 205 is etched to land on the metal below. Sidewall spacer techniques (not shown) can be used to reduce the hole size below the minimum lithography feature size. This step is an option if the heater-to-PCM interface must be reduced to reduce the programming current.

Figure 15C:
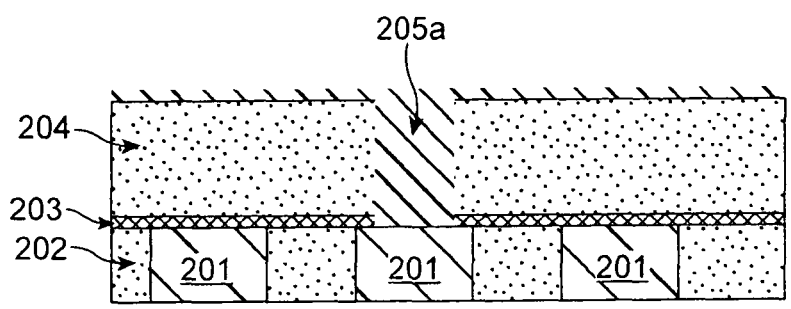

Step 3 is illustrated in FIG. 15C. In Step 3, the heater hole 205 is filled with diffusion barrier material 205a using a CVD (chemical vapor deposition) technique to achieve conformal step coverage and good fill of the hole 205.

Figure 15D:
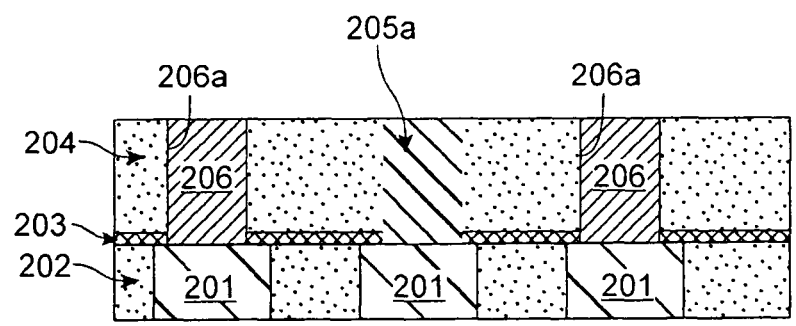

In Step 4, via holes 206a are etched to land on Metalx 201. Via holes 206a are filled with conductive materials 206 using well known techniques, as shown in FIG. 15D. Excess diffusion barrier left from the deposition in Step 3 is removed during Cu CMP (chemical-mechanical polishing). This is only required when bottom-connectivity is desired.

Figure 15E:
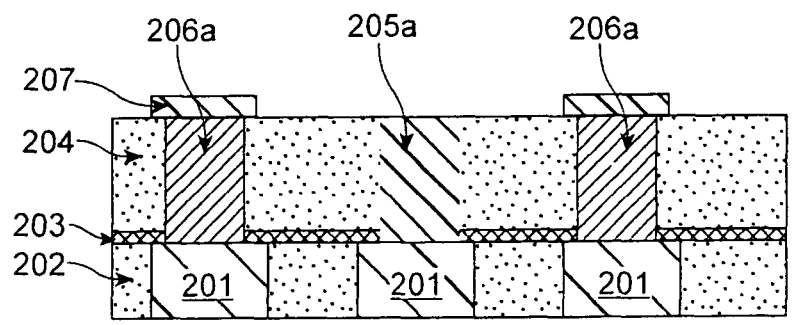
Figure 15F:
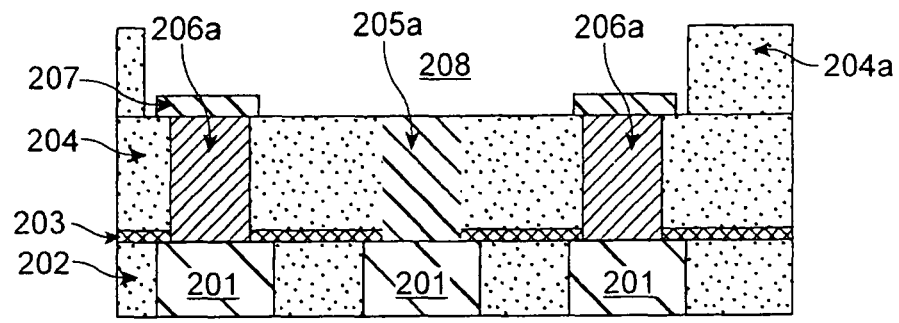
Figure 15G:
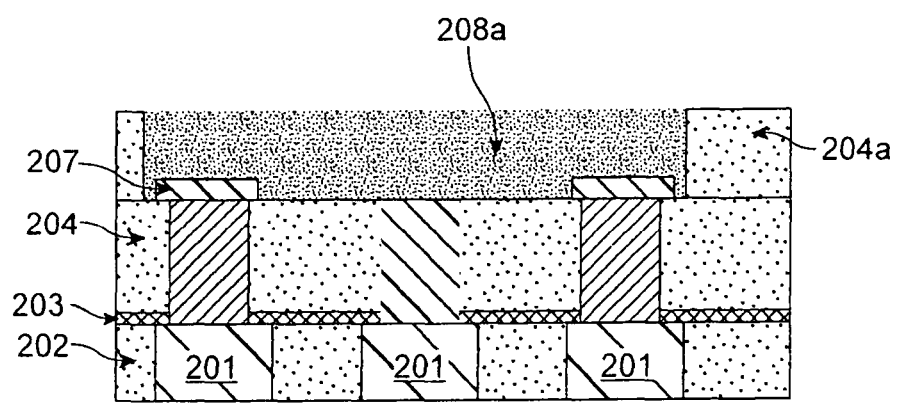

Next, in Step 5, a diffusion barrier metal cap 207, such as TaN or TiN of 250 Å is deposited and patterned to cover the via materials 206a, as seen in FIG. 15E. W or CoWP can also be used. This metal structure represents the bottom electrode or input/output pin for the multi-terminal device. The diffusion barrier metal caps help prevent material inter-diffusion between PCM and via metals. These steps can be omitted if connectivity at Metalx is not desired.

In Step 6 (FIG. 15F), a dielectric layer 204a is deposited (1000 Å) of the same material as the ILD layer and PCM layer trenches 208 are patterned and etched.

Then, in Step 7 (FIG. 15G), a PCM layer 208a is deposited and planarized using CMP (chemical-mechanical polishing).

Figure 15H:
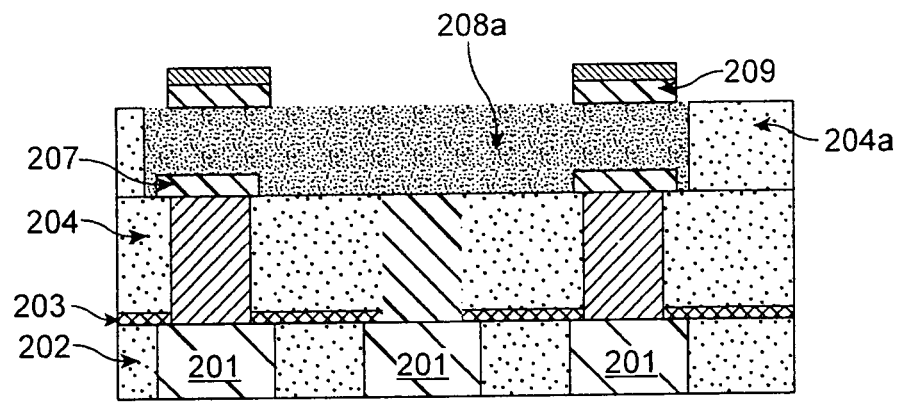

Step 8, illustrated in FIG. 15H, entails deposition and patterning of a PCM interface barrier stack 209 (TiN 200 Å/SiN 250 Å). This step is only required for connectivity from the top.

Figure 15I:
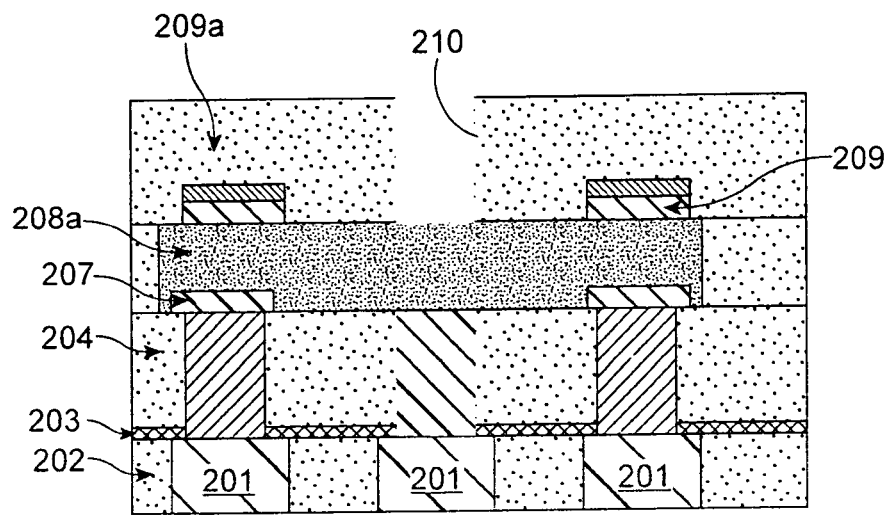
Figure 15J:
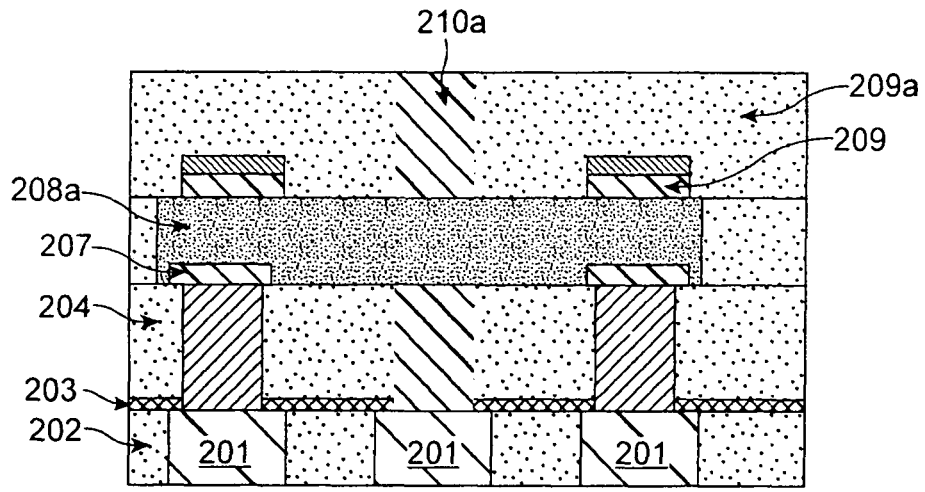

An ILD layer 209a is then deposited, and a heater hole 210 is then etched, in Step 9, to land on the PCM film 208a, as seen in FIG. 15I. Sidewall spacer techniques (not shown) can be used to reduce the hole size below the minimum lithography feature size. This is an option if heater-to-PCM interface must be reduced to reduce the programming current. The heater hole 210 is filled with diffusion barrier material 210a using a CVD technique (500 Å TiN) to achieve conformal step coverage and good fill of the hole, as seen in FIG. 15J. The excess film from the surface can be removed by CMP.

Figure 15K:
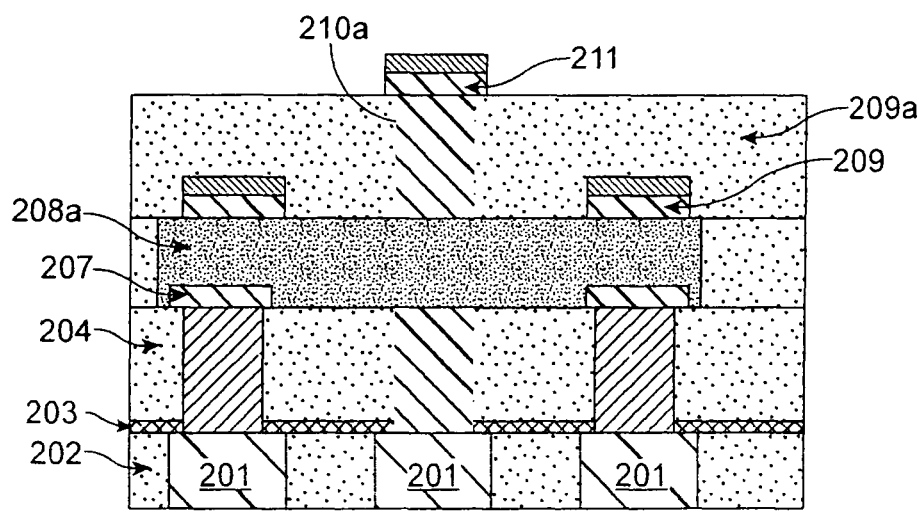
Figure 15L:
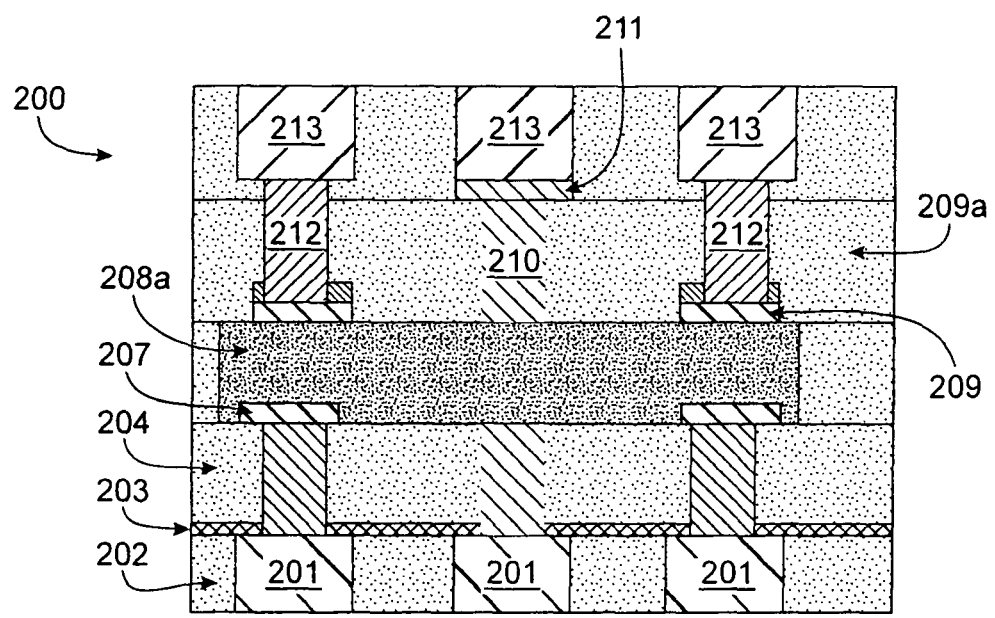
Figure 15M:
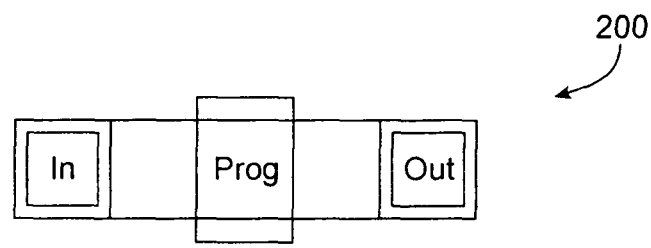

In Step 10, a heater top electrode barrier cap (TiN 250 Å) 211 is deposited and patterned, as shown in FIG. 15K. Then, in Step 11, ILD oxide is deposited and planarized. At this point the standard BEOL processing for defining vias 212 (FIG. 15L) and metal 213 can be resumed, to yield the dual damascene structure 200 shown in FIG. 15L (cross-section) and FIG. 15M (top plan view). It will be appreciated that the etch stop layer on top of the GST seal layers help prevent over-etching and punching through the diffusion barrier film while etching the standard Metalx to Metalx+1 vias. Dielectric layer thicknesses can be varied based on the desired total thickness for the ILD and IMD layers.

As in the first process flow, by using this flow it is possible to generate devices with connectivity at different metal levels and devices with variable number of terminals, including the more common two-terminal device. This can be accomplished by simple modification of the layout. The device floor plan is <20F2. This is three to four times smaller than the area of prior art memory cells using two terminals phase change devices.

Figure 16:
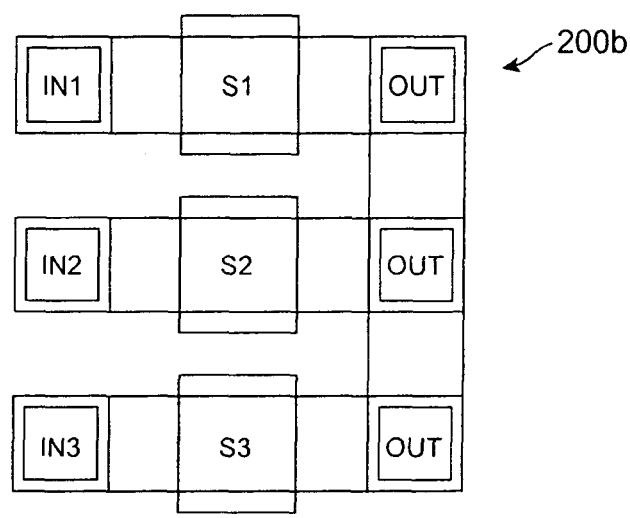
FIG. 16 is top plan view of an arrangement showing multiple PCDs used to obtain a 3:1 multiplexer device fabricated in accordance with the second process flow.

The devices can be easily stacked to obtain any desired mux size (100b), as shown in FIG. 16 (3:1 mux).

The above are exemplary modes of carrying out the invention and are not intended to be limiting. It will be apparent to those of ordinary skill in the art that modifications thereto can be made without departure from the spirit and scope of the invention as set forth in the following claims.

The invention claimed is:

1. A method for selectively establishing an electrical connection, the method comprising:
   coupling a first active terminal to a first terminal of phase change device (PCD) operable to provide a signal;
   coupling a second active terminal to a second terminal of PCD operable to receive the signal; and
   modifying an electrical conductivity state of the PCD having phase change material (PCM) by allowing a control signal to travel from a control terminal of PCD to a heating element and from the heating element to a portion of PCM before reaching the first active terminal or the second active terminal, wherein modifying an electrical conductivity state of the PCD further includes allowing the control signal to pass through higher resistance of the heating element to generate Joule heating, wherein the first and second active terminals, PCM, and control terminal are arranged in a lateral configuration.

2. The method of claim 1, wherein the control signal is applied through a control terminal in thermal and/or electrical communication with the phase-change material.

3. The method of claim 2, wherein the control terminal includes a heating element in thermal contact with the phase-change material.

4. The method of claim 2, wherein the control signal selectively induces any of three discrete conductivity states in the phase-change material (PCM), the first state being a substantially electrically conductive state, the second state being a substantially electrically non-conductive state, and the third state being a self-isolating state in which a portion of the phase-change material proximal to the control terminal is non-conducting, thereby reducing passage of leakage current to or from the control terminal, while a remainder of the phase-change material is in a substantially electrically conductive state.

5. The method of claim 2, wherein the control terminal further includes one or more current sinks in electrical communication with the phase-change material (PCM).

6. The method of claim 2, wherein the control terminal comprises a plurality of control nodes in electrical and/or thermal communication with the phase-change material (PCM).

7. The method of claim 2, wherein said first and second active terminals, phase-change material (PCM), and control terminal are configured as components of a memory element.

8. The method of claim 2, wherein said first and second active terminals, phase-change material (PCM), and control terminal are configured as components of a logic switch.

9. The method of claim 2, wherein said first and second active terminals, phase-change material (PCM), and control terminal are configured as components of a CMOS pass gate.

10. The method of claim 2, wherein said first and second active terminals, phase-change material (PCM), and control terminal are configured as components of a multiplexer.

11. The method of claim 2, wherein said first and second active terminals, phase-change material (PCM), and control terminal are configured as components of an OR gate.

12. The method of claim 2, wherein said first and second active terminals, phase-change material (PCM), and control terminal are configured as components of an AND gate.

13. The method of claim 1, wherein the phase-change material (PCM) is a chalcogenide material selected from one or more of groups containing atom elements in group 4, 5, and 6.

14. The method of claim 1, wherein the phase-change material (PCM) includes one or more of Group IV or V elements.

15. The method of claim 1, wherein the first and second active terminals, phase-change material (PCM), and control terminal are arranged in a stacked configuration.

16. The method of claim 1, wherein the first and second active terminals are respectively connected to first and second cross-bar wires of a switch fabric and are configured to selectively establish an electrical connection between the first and second cross-bar wires based on the control signal.

17. A method for selectively establishing an electrical connection, the method comprising:
 coupling a first active terminal to a first terminal of phase change device (PCD) operable to provide a signal;
 coupling a second active terminal to a second terminal of PCD operable to receive the signal; and
 modifying an electrical conductivity state of the PCD having phase change material (PCM) by allowing a control signal to travel from a control terminal of PCD to a heating element and from the heating element to a portion of PCM before reaching the first active terminal or the second active terminal, wherein modifying an electrical conductivity state of the PCD further includes allowing the control signal to pass through higher resistance of the heating element to generate Joule heating,
 wherein the control signal is applied through a control terminal in thermal and/or electrical communication with the phase-change material,
 wherein the control terminal comprises a plurality of control nodes in electrical and/or thermal communication with the PCM,
 wherein the plurality of control nodes each includes a heating element.

18. A method for selectively establishing an electrical connection, the method comprising:
 coupling a first active terminal of a phase change device (PCD) to a first terminal of phase change material (PCM) element operable to receive a current representing a logic signal from the first active terminal;
 coupling a second active terminal of PCD to a second terminal of PCM element operable to transmit the current to the second active terminal of PCD; and
 modifying an electrical conductivity state of the PCM element by allowing a control signal to travel from a control terminal of PCD to a heating element adjacent to the PCM element, and from the heating element to a portion of PCM element before reaching the first active terminal of PCD or the second active terminal of PCD, wherein modifying an electrical conductivity state of the PCD further includes allowing the control signal to pass through higher resistance of the heating element to generate Joule heating,
 wherein the first and second active terminals, PCM, and control terminal are arranged in a lateral configuration.

19. The method of claim 18, wherein the phase-change material (PCM) element includes chalcogenide material selected from one or more of groups containing atom elements in group 4, 5, and 6.

* * * * *